United States Patent
Zhou

(10) Patent No.: US 10,679,905 B2
(45) Date of Patent: Jun. 9, 2020

(54) SEMICONDUCTOR STRUCTURES AND FABRICATION METHODS THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/105,758

(22) Filed: Aug. 20, 2018

(65) Prior Publication Data

US 2019/0067123 A1 Feb. 28, 2019

(30) Foreign Application Priority Data

Aug. 22, 2017 (CN) .......................... 2017 1 0726817

(51) Int. Cl.
*H01L 21/8238* (2006.01)
*H01L 27/092* (2006.01)
*H01L 21/768* (2006.01)

(52) U.S. Cl.
CPC ........... *H01L 21/823807* (2013.01); *H01L 21/76802* (2013.01); *H01L 21/76877* (2013.01); *H01L 21/823814* (2013.01); *H01L 21/823871* (2013.01); *H01L 27/092* (2013.01)

(58) Field of Classification Search
CPC ..... H01L 21/823807; H01L 21/823871; H01L 27/092; H01L 21/76877; H01L 21/76802; H01L 21/823814; H01L 21/823821; H01L 27/0924; H01L 29/7848; H01L 2029/7858
See application file for complete search history.

(56) References Cited

U.S. PATENT DOCUMENTS

| | | | |
|---|---|---|---|
| 9,390,981 B1 * | 7/2016 | Basker | ............ H01L 21/823814 |
| 2008/0242015 A1 | 10/2008 | Lee et al. | |
| 2012/0091533 A1 | 4/2012 | Kim et al. | |
| 2012/0187459 A1 * | 7/2012 | Pan | ................ H01L 21/823807 257/288 |

* cited by examiner

*Primary Examiner* — Syed I Gheyas
(74) *Attorney, Agent, or Firm* — Anova Law Group, PLLC

(57) ABSTRACT

A method for fabricating a semiconductor structure includes forming a plurality of first gate structures on a first region of a substrate, a plurality of second gate structures on a second region of the substrate, and a first stress layer on both sides of each first gate structure; forming a first-region mask layer on the first stress layer; forming a second stress layer on both sides of each second gate structure; forming a contact-hole etch stop layer on the second stress layer; forming a plurality of first contact holes on the first stress layer and a plurality of second contact holes on the second stress layer to expose the contact-hole etch stop layer; at least partially removing the contact-hole etch stop layer in each first contact hole; and removing the first-region mask layer in each first contact hole and the contact-hole etch stop layer in each second contact hole.

19 Claims, 9 Drawing Sheets

SEMICONDUCTOR STRUCTURES AND FABRICATION METHODS THEREOF

CROSS-REFERENCES TO RELATED APPLICATIONS

This application claims the priority of Chinese Patent Application No. CN201710726817.0, filed on Aug. 22, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

As very-large-scale integration (VLSI) becomes a development trend of integrated circuits (ICs), the internal circuit density of ICs increases and the number of the components included in ICs also increases, and accordingly, the size of the components decreases. With the reduction of the size of semiconductor structures, the length of the channel of the devices in the semiconductor structures becomes shorter. Because of the reduction of the channel length, the gradient channel approximation is no longer valid, and various undesired physical effects (especially the short channel effect) become prominent, causing degradation of the performance and the reliability of the device and also limiting the further reduction of the size of the device.

As the circuit density increases, the wafer surface cannot provide enough area for the formation of the connection wires. After the components are reduced, in order to meet the interconnection requirements, the design of interconnections between multiple metal layers (i.e., two or more layers) has become one of the methods commonly used in the VLSI technology. The electrical connections between different metal layers and/or between each metal layer and the semiconductor device may be realized by a plurality of plugs.

In the meantime, the carrier mobility is one of the main factors that may affect the performance of a transistor. Effectively increasing the carrier mobility has become one of the key points in the manufacturing process of transistor devices. Since stress may be able to change the energy gap and the carrier mobility of silicon, it becomes an increasingly common method to improve the performance of a transistor by introducing a stress layer into the transistor. For example, a stress layer that can provide tensile stress is formed in an N-type transistor to improve the electron mobility, and a stress layer that can provide compressive stress is formed in an N-type transistor to improve the hole mobility.

However, according to existing fabrication methods, forming a plurality of plugs in a semiconductor structure that contains a stress layer may also cause damage to the stress layer, and thus may further lead to degraded performance of the formed semiconductor structure. The disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor structure. The method includes providing a substrate, including a first region and a second region; forming a plurality of first gate structures on the first region of the substrate, a plurality of second gate structures on the second region of the substrate, and a first stress layer in the substrate on both sides of each first gate structure; forming a first-region mask layer on the first stress layer; forming a second stress layer in the substrate on both sides of each second gate structure using the first-region mask layer as a mask; forming a contact-hole etch stop layer on the second stress layer; and forming a plurality of first contact holes on the first stress layer and a plurality of second contact holes on the second stress layer. The contact-hole etch stop layer formed on the first stress layer is exposed at a bottom of each first contact hole, and the contact-hole etch stop layer formed on the second stress layer is exposed at a bottom of each second contact hole. The method further includes removing at least a portion of the contact-hole etch stop layer exposed at the bottom of each first contact hole; and removing the first-region mask layer at the bottom of each first contact hole and the contact-hole etch stop layer at the bottom of each second contact hole to expose the first stress layer and the second stress layer, respectively.

Another aspect of the present disclosure provides a semiconductor structure. The semiconductor structure includes a substrate, including a first region and a second region; a plurality of first gate structures, formed on the first region of the substrate; a plurality of second gate structures, formed on the second region of the substrate; a first stress layer, formed in the substrate on both sides of each first gate structure; a second stress layer, formed in the substrate on both sides of each second gate structure; a first-region mask layer, formed at least on the first stress layer; a contact-hole etch stop layer, formed on the second stress layer and at least a portion of the first-region mask layer; an interlayer dielectric layer, formed on the first stress layer and the second stress layer; a plurality of first contact holes, formed through the interlayer dielectric layer on the first stress layer; and a plurality of second contact holes, formed through the interlayer dielectric layer on the second stress layer. The thickness of the contact-hole etch stop layer at the bottom of each first contact hole is smaller than the thickness of the contact-hole etch stop layer between the interlayer dielectric layer and the first stress layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-4 illustrate schematic cross-section views of structures at various stages in a process for fabricating a semiconductor structure.

Figure 1:
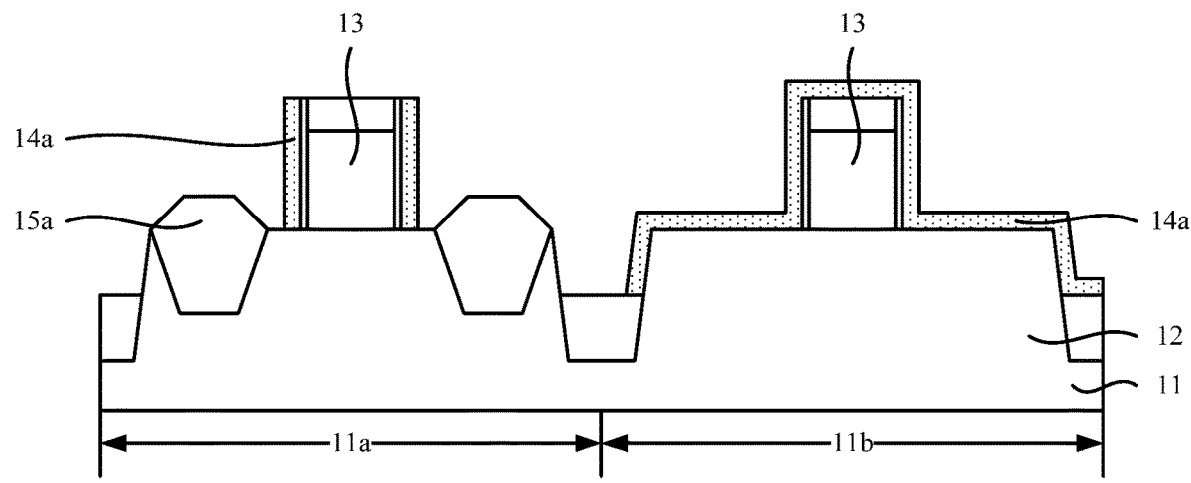
FIGS. 1-4 illustrate schematic cross-section views of structures at various stages in a process for fabricating a semiconductor structure.

Referring to FIG. 1, a substrate 11 is provided. A plurality of fin structures 12 are formed on the substrate 11, and a plurality of gate structure 13 formed on the fin structures 12. The substrate 11 includes a first region 11a and a second region 11b. The first region 11a of the substrate 11 is used to form a p-type metal-oxide-semiconductor (PMOS) device. On the first region 11a of the substrate 11, a first stress layer 15a is formed in the fin structure 12 on both sides of each gate structure 13.

Figure 2:
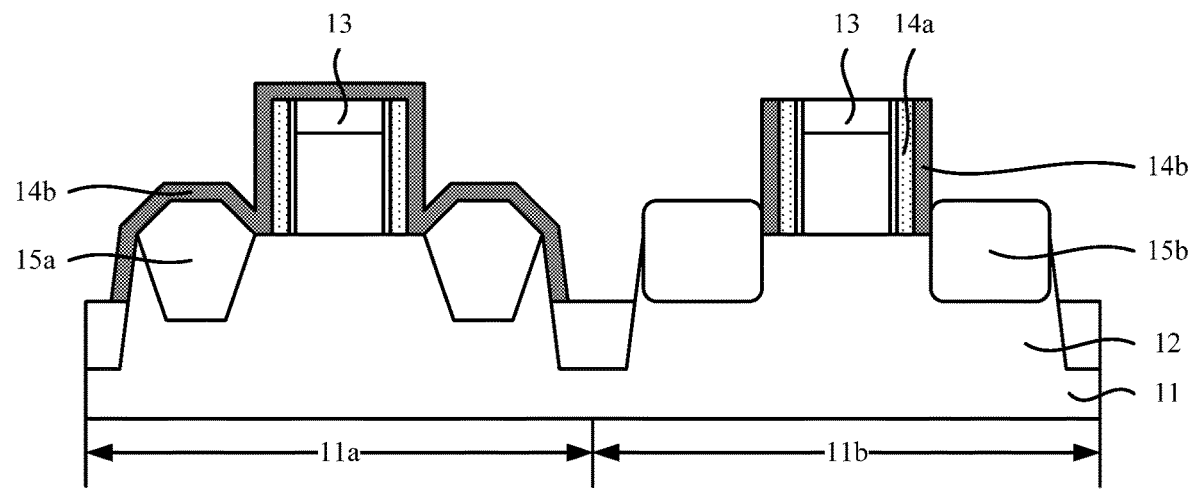

Referring to FIG. 2, on the second region 11b of the substrate 11, a second stress layer 15b is formed in the fin structure 12 on both sides of each gate structure 13.

Figure 3:
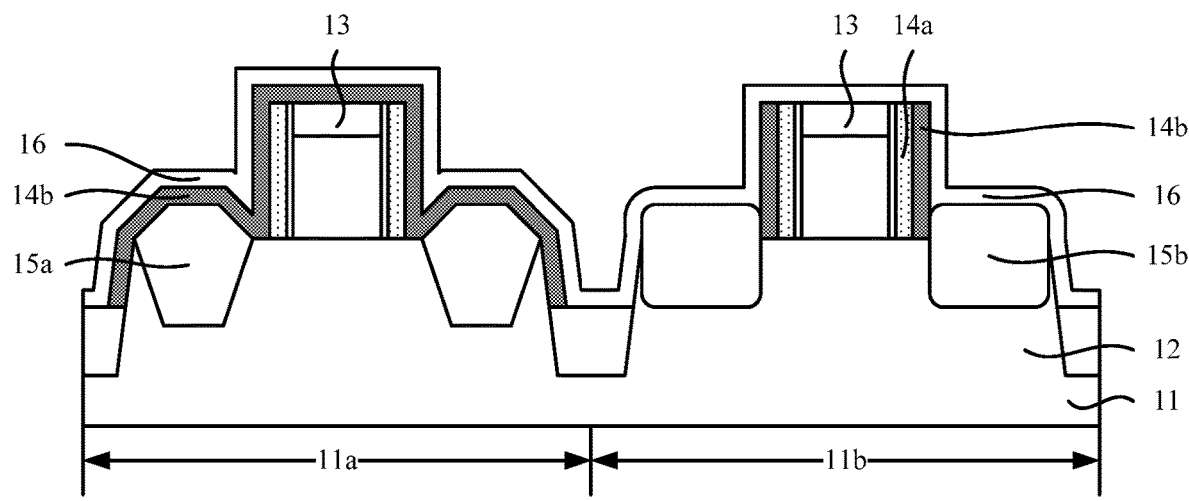

Referring to FIG. 3, a contact-hole etch stop layer 16 is formed. The contact-hole etch stop layer 16 covers the first stress layer 15a and the second stress layer 15b.

Figure 4:
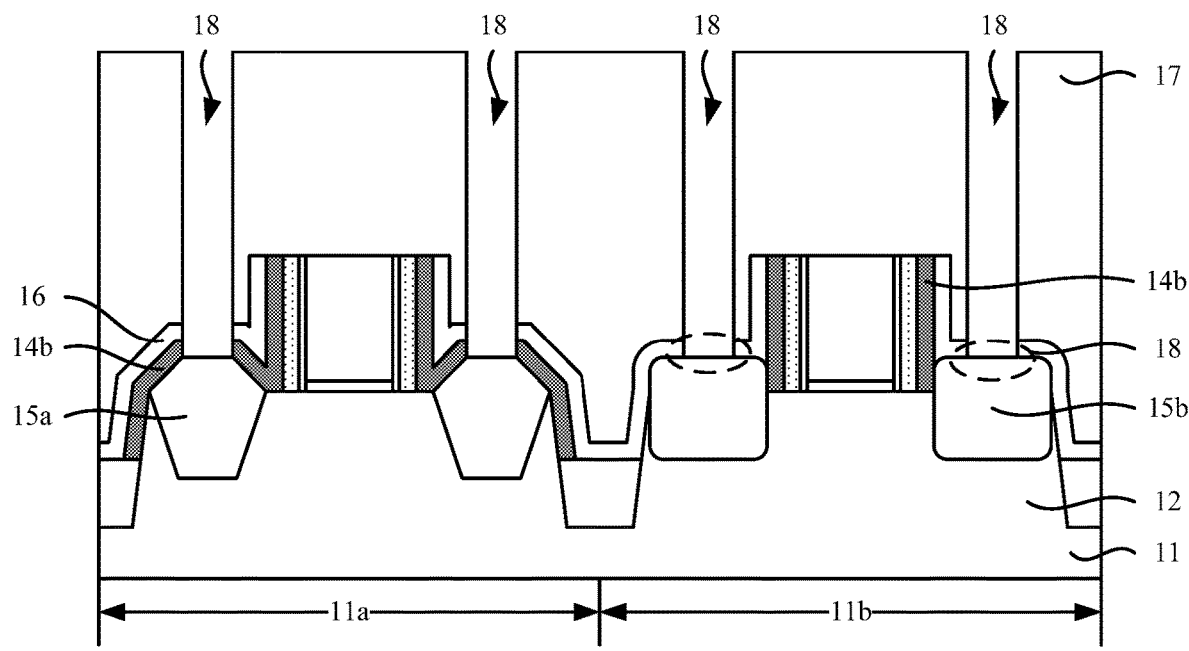

Referring to FIG. 4, an interlayer dielectric layer 17 is formed to cover the contact-hole etch stop layer 16. A plurality of contact holes 18 are formed on the first stress layer 15a and the second stress layer 15b. Each contact hole 18 is formed through the interlayer dielectric layer 17, and thus at the bottom of each contact hole 18, the first stress layer 15a or the second stress layer 15b is exposed.

As shown in FIG. 1, during the process for forming the first stress layer 15a, a first mask layer 14a needs to be formed to protect the structures formed on the second region 11b of the substrate 11. On the second region 11b of the substrate 11, the first mask layer 14a covers the plurality of fin structures 12 and the plurality of gate structures 13. On the first region 11a of the substrate 11, the portion of the first mask layer 14a formed on the surface of the fin structure 12 on both sides of each gate structure 13 is removed for further formation of the first stress layer 15a.

Similarly, as shown in FIG. 2, during the process for forming the second stress layer 15b, a second mask layer 14b needs to be formed to protect the structures formed on the first region 11a of the substrate 11. On the first region 11a of the substrate 11, the second mask layer 14b covers the plurality of fin structures 12, the plurality of gate structures 13, and the first stress layer 15a. On the second region 11b of the substrate 11, the portion of the first mask layer 14a and the second mask layer 14b formed on the surface of the fin structures 12 on both sides of each gate structure 13 is removed for further formation of the second stress layer 15b.

As shown in FIG. 3, during the process for forming the contact-hole etch stop layer 16, on the first region 11a of the substrate 11, the contact-hole etch stop layer 16 is formed on the second mask layer 14b that covers the first stress layer 15a, and on the second region 11b of the substrate 11, the contact-hole etch stop layer 16 is formed directly on the second stress layer 15b.

Therefore, the second mask layer 14b and the contact-hole etch stop layer 16 are both formed on the first stress layer 15a, and only the contact-hole etch stop layer 16 is formed on the second stress layer 15b. That is, the thickness of the film covering the first stress layer 15a is larger than the thickness of the film covering the second stress layer 15b.

As shown in FIG. 4, the process for forming the plurality of contact holes 18 includes the following steps. A plurality of initial contact holes (not shown) are formed by etching the interlayer dielectric layer 17 to expose the contact-hole etch stop layer 16. Each initial contact hole penetrates through the interlayer dielectric layer 17, and a portion of the contact-hole etch stop layer 16 is exposed at the bottom of the initial contact hole. Further, the portion of the contact-hole etch stop layer 16 exposed at the bottom of each initial contact hole is removed to expose the first stress layer 15a or the second stress layer 15b. As such, the plurality of contact holes 18 are formed.

Because the first stress layer 15a is covered by both the second mask layer 15b and the contact-hole etch stop layer 16, and the second stress layer 15b is covered only by the contact-hole etch stop layer 16, during the process for removing the portion of the contact-hole etch stop layer 16 on the bottom of the plurality of initial contact holes, the film layer to be removed from the first region 11a of the substrate 11 may have a larger amount as compared to the film layer to be removed from the second region 11b of the substrate 11. As such, when removing the film layer formed on the first stress layer 15a, the top portion of the second stress layer 15b (indicated by the dashed circles in FIG. 4) may be easily damaged, and thus the performance of the second stress layer 15b may be degraded. Therefore, the performance of the formed semiconductor structure may be degraded.

Figure 15:
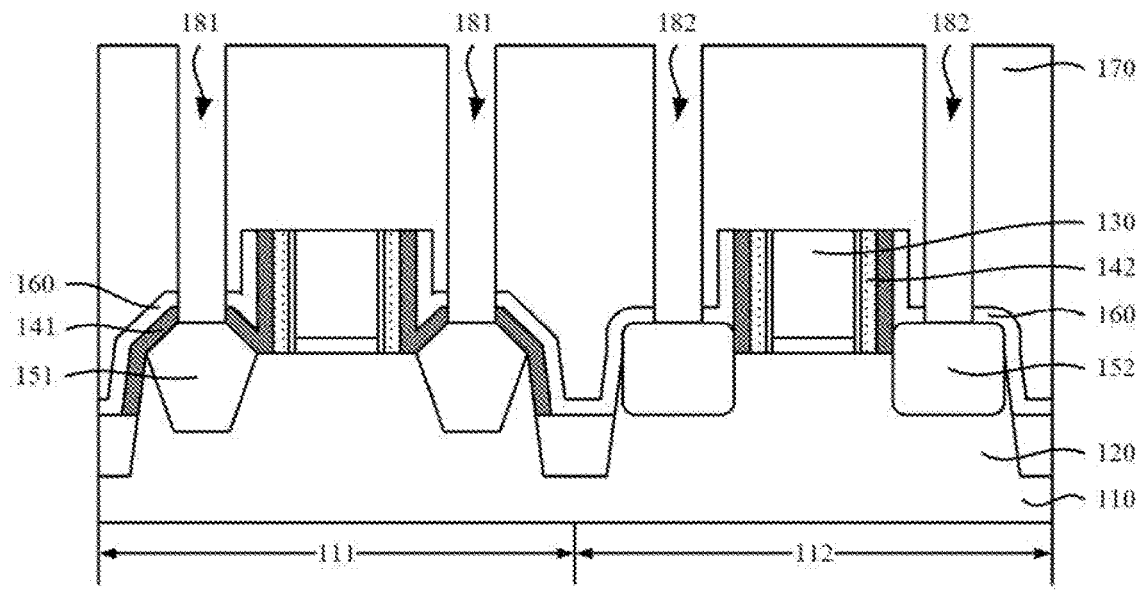
Figure 16:
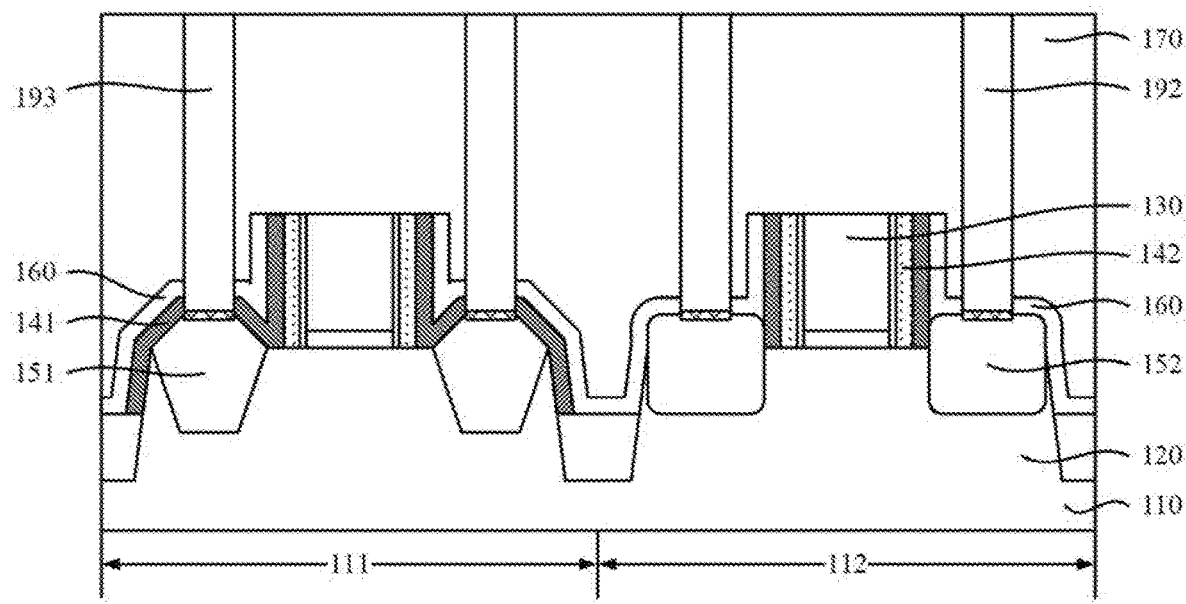
Figure 17:
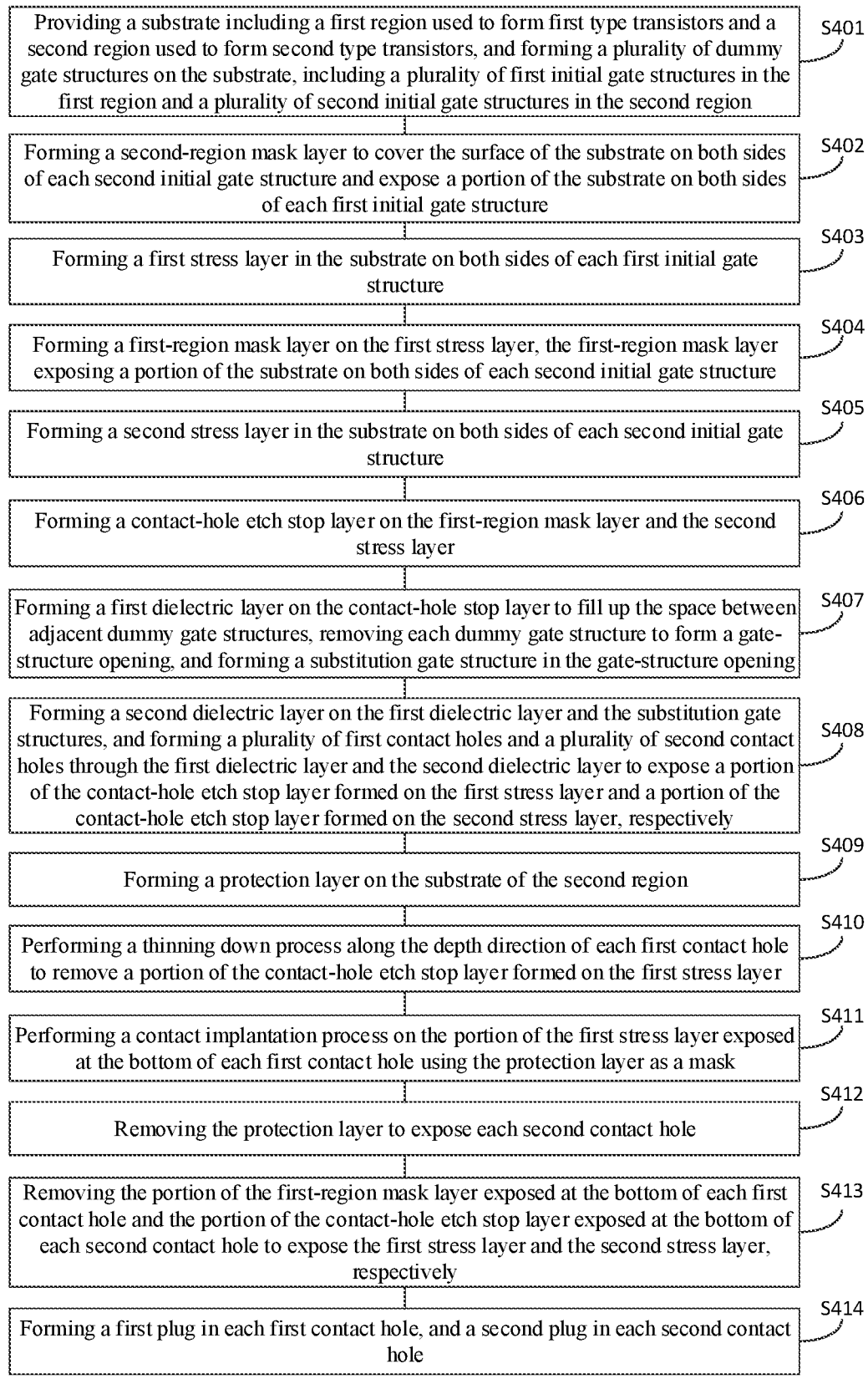
FIG. 17 illustrates a flowchart of an exemplary method for fabricating a semiconductor device consistent with various embodiments of the present disclosure.

The present disclosure provides a method for forming a semiconductor structure. FIG. 17 illustrates a flowchart of an exemplary method for fabricating a semiconductor device consistent with various embodiments of the present disclosure. FIGS. 5-16 illustrate schematic cross-section views of semiconductor structures at certain stages of the exemplary method.

Figure 5:
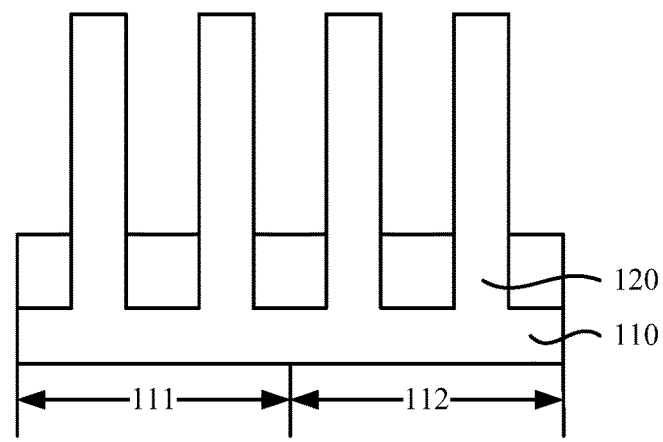
FIGS. 5-16 illustrate schematic cross-section views of semiconductor structures at certain stages of an exemplary method for fabricating a semiconductor structure consistent with some embodiments of the present disclosure.
Figure 6:
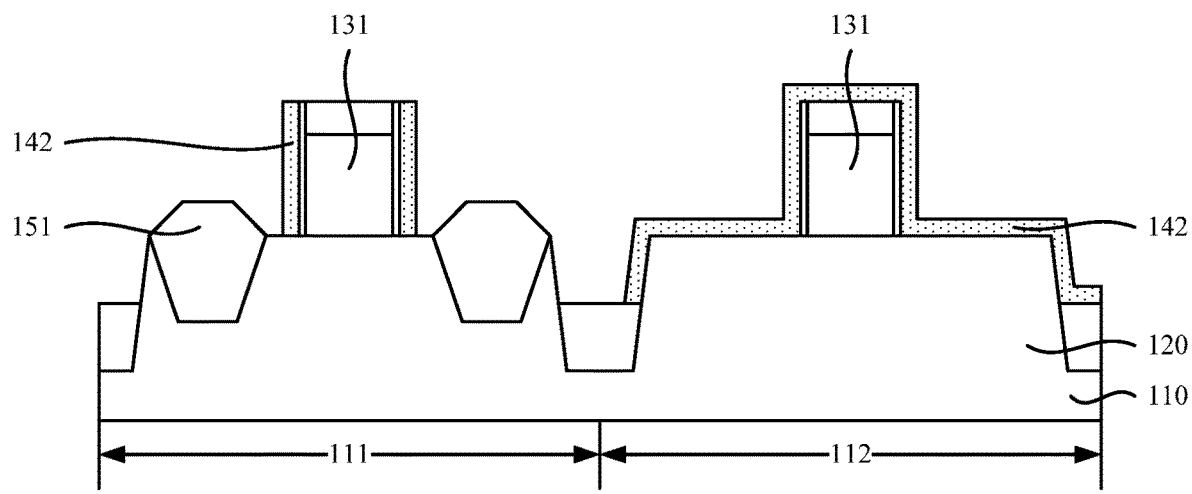

Referring to FIG. 17, a substrate including a first region used to form a plurality of first type transistors and a second region used to form a plurality of second type transistors may be provided, and a plurality of dummy gate structures may be formed on the substrate, and the plurality of dummy gate structures may include a plurality of first initial gate structures formed on the first region and a plurality of second initial gate structures formed on the second region (S401). FIGS. 5-6 illustrate schematic cross-section views of a semiconductor structure consistent with some embodiments of the present disclosure. Specifically, FIG. 5 illustrates a schematic cross-section view of the semiconductor structure in a direction perpendicular to the length direction of the fin structures, and FIG. 6 illustrates a schematic cross-section view of the semiconductor structure in a direction parallel to the length direction of the fin structures. For illustrative purposes, only a portion of the semiconductor structure is shown in each figure. For example, FIG. 5 shows two fin structures in each of the first region and the second region, and FIG. 6 shows one fin structure in each of the first region and the second region. The number of the fin structures on the first region or on the second region may have a value other than one or two.

Referring to FIGS. 5-6, a substrate 110, including a first region 111 used to form a plurality of first type transistors and a second region 112 used to form a plurality of second type transistors, may be provided. A plurality of first initial gate structures (not labeled) may be formed on the first region 111 of the substrate 110, and a plurality of second initial gate structures (not labeled) may be formed on the second region 112 of the substrate 110.

The substrate 110 may be used to provide a process platform for subsequent steps. The first region 111 of the substrate 110 may be used to form a plurality of first type transistors, and the second region 112 of the substrate 110 may be used to form a plurality of second type transistors. In one embodiment, the semiconductor structure to be formed is a complementary metal-oxide-semiconductor (CMOS) device, the first type transistor may be a P-type metal-oxide-semiconductor (PMOS) transistor, and the second type transistor may be an N-type metal-oxide-semiconductor (NMOS) transistor.

In one embodiment, the first region 111 of the substrate 110 and the second region 112 of the substrate 110 may be arranged adjacent to each other. In other embodiments, the first region of the substrate and the second region of the substrate may be spaced apart, i.e., the first region of the substrate and the second region of the substrate may not be arranged next to each other.

In one embodiment, the semiconductor structure to be formed may also include a plurality of fin structures. Therefore, a plurality of discrete fin structures 120 may be formed on the substrate 110, and the channels of the formed semiconductor structure may be in the fin structures 120. In other embodiments, the semiconductor structure may have a planar structure, and accordingly, the substrate may be a planar substrate. That is, the substrate may not include any fin structure protruding from the substrate.

In one embodiment, the substrate 110 may be made of single-crystalline silicon. In other embodiments, the substrate may be made of one or more of polycrystalline silicon, amorphous silicon or germanium, single-crystalline germanium, SiGe, SiC, GaAs, InAs, and other appropriate semiconductor materials. Alternatively, the substrate may be made of silicon on insulator SOI), germanium on insulator (GOI), glass, or any other appropriate semiconductor material or composite structure. The material of the substrate 110 may be a material that is accommodate to process needs, or may be a material that can be easily integrated.

In one embodiment, the fin structure 120 and the substrate 110 may be made of a same material, for example, single-crystalline silicon. In other embodiments, the fin structure may be made of a material different from the material of the substrate. The fin structure may be made of germanium, SiGe, SiC, GaAs, InAs, or any other appropriate semiconductor material.

In one embodiment, the plurality of fin structures 120 and the substrate 110 may be formed simultaneously. For example, the process for forming the substrate 110 and the plurality of fin structures 120 may include the following steps. An initial substrate may be provided. A patterned fin-structure mask layer (not shown) may be formed on the surface of the initial substrate. The patterned fin-structure mask layer may define the position and the dimension of the fin structures to be formed. The initial substrate may then be etched using the patterned fin-structure mask layer as an etch mask. As a portion of the initial substrate is removed, the substrate 110 and the plurality of fin structures 120 protruding from the substrate 110 may be formed.

In one embodiment, the semiconductor structure may include a plurality of metal gate structures formed through a gate last process. Therefore, the plurality of first initial gate structures and the plurality of second initial gate structures may be dummy gate structures 131 used to occupy spaces for the subsequently-formed metal gates. In other embodiments, the plurality of first initial gate structures and the plurality of second initial gate structures may be the gate structures of the semiconductor structure to be formed, and may be used to turn on or turn off the channels in the formed semiconductor structure. That is, in the subsequently-formed semiconductor structure, the first initial gate structure may be directly used as a first gate structure for controlling the channel in a corresponding first type transistor, and the second initial gate structure may be directly used as a second gate structure for controlling the channel in a corresponding second type transistor.

In one embodiment, the plurality of first initial gate structures and the plurality of second fin structures are all dummy gate structures 131. Each dummy gate structure 131 may have a multi-layer structure, including a dummy oxide layer (not shown), a dummy gate layer (not shown) formed on the dummy oxide layer. For example, the plurality of fin structures 120 may be formed on the substrate 110, and each dummy gate structure 131 may be formed across a corresponding fin structure 120 to cover a portion of the top and the sidewall surfaces of the fin structure 120. Therefore, the dummy oxide layer and the dummy gate layer may be formed across the fin structure 120 and cover the portion of the top and the sidewall surfaces of the fin structure 120. In other embodiments, the dummy gate structure may have a single-layer structure, and accordingly, the dummy gate structure may only include a dummy gate layer.

In one embodiment, the dummy oxide layer may be made of $SiO_x$. In other embodiments, the dummy oxide layer may be made of SiON. In one embodiment, the dummy gate layer may be made of poly-crystalline silicon. In other embodiments, the dummy gate layer may be made of $SiO_x$, $SiN_x$, SiON, SiC, SiCN, SiCON, amorphous silicon, or any other appropriate material.

In one embodiment, the process for forming the plurality of dummy gate structures 131 may include the following exemplary steps. An oxide material layer may be formed on the surface of each fin structure 120. A dummy gate material layer may be formed on the oxide material layer. A gate mask layer (not shown) may then be formed on the surface of the dummy gate material layer. The dummy gate layer may be formed on the oxide material layer by etching the dummy gate material layer using the gate mask layer as an etch mask to expose the oxide material layer. The dummy gate layer may be formed across the fin structure 120 and may cover a portion of the top and the sidewall surfaces of the fin structure 120. The portion of the oxide material layer exposed by the dummy gate layer may be removed to expose the surface of the fin structure 120. The remaining portion of the dummy gate material layer covered by the dummy gate layer may become the dummy oxide layer. Moreover, the dummy oxide layer and the dummy gate layer formed on the surface of each fin structure 112 on the first region 111 of the substrate 110 may form a first gate structure, and the dummy oxide layer and the dummy gate layer formed on the surface of each fin structure 112 on the second region 112 of the substrate 110 may form a second gate structure.

In one embodiment, after forming the plurality of dummy gate structures 131, the gate mask layer (not shown) formed on the top surface of each dummy gate structure 131 may be retained. The gate mask layer may be made of $SiN_x$, and the gate mask layer may provide protection for the top surface of the dummy gate structure 131 during subsequent processes. In other embodiment, the gate mask layer may be made of a material including SiON, SiC, or BN.

Returning to FIG. 17, a second-region mask layer may be formed to cover the surface of the substrate on both sides of each second initial gate structure, the second-region mask layer exposing a portion of the substrate on both sides of each first initial gate structure (S402). The semiconductor structure shown in FIG. 6 includes a second-region mask layer consistent with some embodiments of the present disclosure.

Referring to FIG. 6, a second-region mask layer 142 may be formed. The second-region mask layer 142 may cover the surface of the fin structure 120 on both sides of each second initial gate structure (i.e., each dummy gate structure 131 formed on the second region 112 of the substrate 110) and may expose a portion of the fin structure 120 on both sides of each first initial gate structure.

The second-region mask layer 142 may be used to protect the fin structure 120 on both sides of each second initial gate structure during subsequent formation of a first opening, such that the fin structure 120 on both sides of the second initial gate structure may not be damaged. In one embodiment, the second-region mask layer 142 may be made of $SiN_x$. In other embodiments, the second-region mask layer may be made of SiON, or any other appropriate material capable of providing protection.

In one embodiment, the second-region mask layer 142 may be formed by an atomic layer deposition (ALD) process. By forming the second-region mask layer 142 through the ALD process, the formed second-region mask layer 142 may be capable of conformal coverage. In addition, the formed second-region mask layer 142 may also have a high density, and thus the protection of the second-region mask layer 142 may be improved. The second-region mask layer 142 may not only cover the surface of the fin structure 120 on both sides of each second initial gate structure, but also cover the top and the sidewall surfaces of each second initial gate structure, the top and sidewall surfaces of each first initial gate structure, and the portion of the second-region mask layer 142 formed on the fin structure 120 on both sides of each first initial gate structure.

Returning to FIG. 17, a first stress layer may be formed in the substrate on both sides of each first initial gate structure (S403). The semiconductor structure shown in FIG. 6 includes a first stress layer consistent with some embodiments of the present disclosure.

Referring to FIG. 6, a first stress layer 151 may be formed in the substrate 110 on both sides of each first initial gate structure.

In one embodiment, the first stress layer 151 may be used to form a source/drain doped region of a first type transistor. The first stress layer 151 may induce stress into the channel region under each first initial gate structure (i.e., each dummy gate structure 131 formed on the first region 111 of the substrate 110) to improve the mobility of the carriers in the channel.

In one embodiment, a plurality of fin structures 120 may be formed on the substrate 110, and accordingly, the first stress layer 151 may be formed in the fin structure 120 on both sides of each first initial gate structure. The plurality of first type transistors may be, for example, a plurality of PMOS transistors. Accordingly, the first stress layer 151 may be a stress layer doped with P-type ions. In one embodiment, the first stress layer 151 may be made of SiGe or Si, and doped with P-type ions, such as B ions, Ga ions, and/or In ions.

In one embodiment, the process for forming the first stress layer 151 may include the following exemplary steps. After forming the second-region mask layer 142, the portion of the second-region mask layer 142 formed on the fin structure 120 on both sides of each first initial gate structure may be removed to expose the portion of the fin structure 120 on both sides of each initial first gate structure. A first opening (not shown) may be formed in the fin structure 120 on each side of the first initial gate structure by etching the fin structure 120 using the second-region mask layer 142 as a mask. The first stress layer 151 may then be formed in the first opening by a first stress material to fill up the first opening.

The removal of the portion of the second-region mask layer 142 formed on the fin structure 120 on both sides of each first initial gate structure may be used to expose the top surface of the fin structure on both sides of the first initial gate structure, and thus provide a process basis for the subsequent formation of the first opening.

The first opening may be used to provide a process space for the first stress layer 151. In one embodiment, the plurality of first type transistors may be PMOS transistors, and thus the first opening may have an Σ shape. That is, the first opening may have a sharp corner in a direction towards the channel region of the first initial gate structure.

When removing the second-region mask layer 142 formed on the fin structure 120 on both sides of each first initial gate structure, the portion of the second-region mask layer 142 formed on the top surface of each first initial gate structure may be simultaneously removed. Therefore, as shown in FIG. 6, on the first region 111 of the substrate 110, the remaining portion of the second-region mask layer 142 may cover the sidewall surfaces of each first initial gate structure.

The process for etching the fin structure 120 on both sides of the first initial gate structure to form the first opening may be consistent with the existing technology.

In one embodiment, a first stress material may be filled into the first opening to form the first stress layer 151. For example, the first stress material may be filled in through an epitaxial growth method. During the process for filling the first stress material, an in-situ doping process may be performed to for the first stress layer 151. As such, the first stress layer 151 may be doped with doping ions.

In one embodiment, the plurality of first type transistors may be a plurality of PMOS transistors, and the plurality of second type transistors may be a plurality of N-type metal-oxide-semiconductor (NMOS) transistors. That is, the stress layer in the PMOS transistors may be formed prior to forming the NMOS transistors. As such, the distance between the first stress layer 151 and the channel region of a subsequently-formed first gate structure may be effectively reduced, which may be conducive to improving the strength of the stress applied by the first stress layer 151. Therefore, the mobility of the carriers in the channel, especially the mobility of the holes in the PMOS transistors may be improved.

Figure 7:
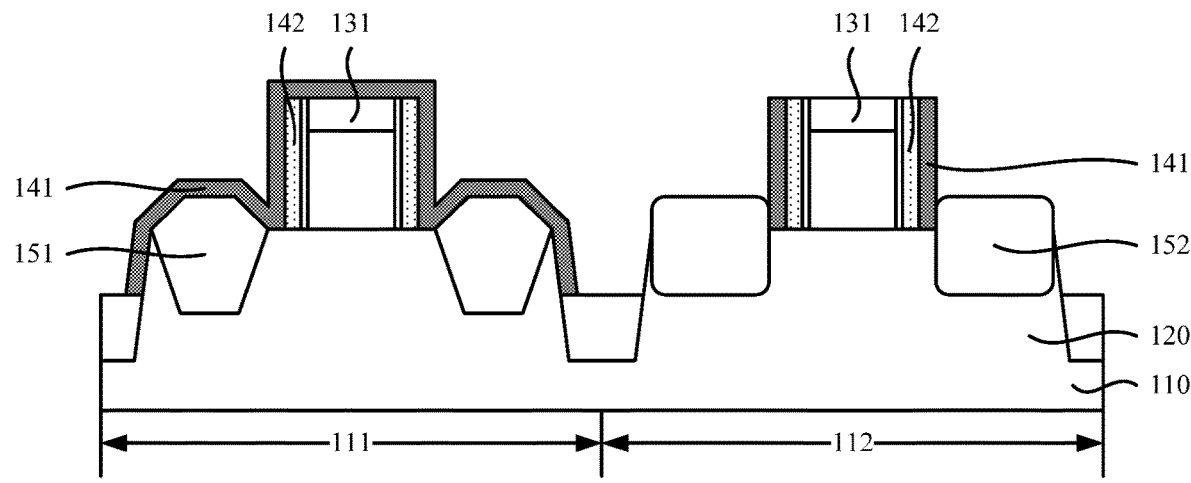

Further, returning to FIG. 17, a first-region mask layer may be formed on the first stress layer to cover the first stress layer, the first-region mask layer exposing a portion of substrate on both sides of each second initial gate structure (S404). FIG. 7 illustrates a schematic cross-section view of a corresponding semiconductor structure consistent with some embodiments of the present disclosure.

Referring to FIG. 7, a first-region mask layer 141 may be formed to cover the first stress layer 151. The first-region mask layer 141 formed on the first stress layer 151 may be used to provide protection for the first stress layer 151. For example, during a subsequent process for forming a second stress layer, the first-region mask layer 141 may prevent damage to the first stress layer 151.

In one embodiment, the first-region mask layer 141 may be made of $SiN_x$. In other embodiments, the first-region mask layer may be made of any other appropriate material that is capable of providing protection and suitable for being used as a mask.

In one embodiment, the first-region mask layer 141 may be formed through an ALD process. By forming the first-region mask layer 141 through the ALD process, the formed first-region mask layer 141 may be capable of conformal coverage. In addition, the formed first-region mask layer 141 may also have a high density, and thus the protection of the first-region mask layer 141 may be improved.

In one embodiment, the first-region mask layer 141 may not only cover the surface of the first stress layer 151, but also cover the top and the sidewall surfaces of each first initial gate structure, the top and sidewall surfaces of each second initial gate structure, and the portion of the fin structure 120 on both sides of each second initial gate structure.

The thickness of the first-region mask layer 141 may not be too large or too small. When the thickness of the first-region mask layer 141 is too small, the first-region mask layer 141 may not be able to provide desired protection such that damage to the first stress layer 151 may be increased, which may not be conducive to improving the manufacturing yield and the device performance. However, an overly large thickness of the first-region mask layer 141 may cause material waste and may increase the process difficulty. In one embodiment, the thickness of the first-region mask layer 141 may be in a range of approximately 50 Å to 120 Å.

Further, returning to FIG. 17, a second stress layer may be formed in the substrate on both sides of each second initial gate structure (S405). The semiconductor structure shown in FIG. 7 includes a second stress layer consistent with some embodiments of the present disclosure.

Referring to FIG. 7, a second stress layer 152 may be formed in the substrate 110 on both sides of each second initial gate structure.

In one embodiment, the second stress layer 152 may be used to form a source/drain doped region of a second type transistor. The second stress layer 152 may induce stress into the channel region under each second initial gate structure (i.e., each dummy gate structure 131 formed on the second region 112 of the substrate 110) to improve the mobility of the carriers in the channel.

In one embodiment, a plurality of fin structures 120 may be formed on the substrate 110, and accordingly, the second stress layer 152 may be formed in the fin structure 120 on both sides of each second initial gate structure.

In one embodiment, the plurality of second type transistors may be a plurality of NMOS transistors. Accordingly, the second stress layer 152 may be a stress layer doped with N-type ions. In one embodiment, the second stress layer 152 may be made of SiC or Si, and doped with N-type ions, such as P ions, As ions, and/or Sb ions.

In one embodiment, the process for forming the second stress layer 152 may include the following exemplary steps. After forming the first-region mask layer 141, the portion of the first-region mask layer 141 formed on the fin structure 120 on both sides of each second initial gate structure may be removed to expose the portion of the fin structure 120 on both sides of each second initial gate structure. A second opening (not shown) may be formed in the fin structure 120 on each side of the second initial gate structure by etching the fin structure 120 using the second-region mask layer 142 as a mask. The second stress layer 152 may then be formed by using a second stress material to fill up the second opening.

Removing the portion of the first-region mask layer 141 formed on the fin structure 120 on both sides of each second initial gate structure may be used to expose the top surface of the fin structure 120 on both sides of the second initial gate structure, and thus provide a process basis for subsequent formation of a second opening. In one embodiment, when removing the portion of the first-region mask layer 141 formed on both sides of each second initial gate structure, the portion of the first-region mask layer 141 formed on the top of each second initial gate structure may be simultaneously removed. Therefore, as shown in FIG. 7, on the second region 112 of the substrate 110, the first-region mask layer 141 may be located on the sidewall surfaces of each second initial gate structure.

The second opening may be used to provide a process space for the second stress layer 152. In one embodiment, the plurality of second type transistors may be NMOS transistors, and thus the second opening may have a U shape.

The process for etching the portion of the fin structure 120 on both sides of each second initial gate structure to form the second opening may be any appropriate fabrication process according to the existing technology.

In one embodiment, a second stress material may be filled into the second opening to form the second stress layer 152. For example, the second stress material may be filled in through an epitaxial growth method. During the process for filling the second stress material, an in-situ doping process may be performed to for the second stress layer 152. As such, the second stress layer 152 may be doped with doping ions.

Figure 8:
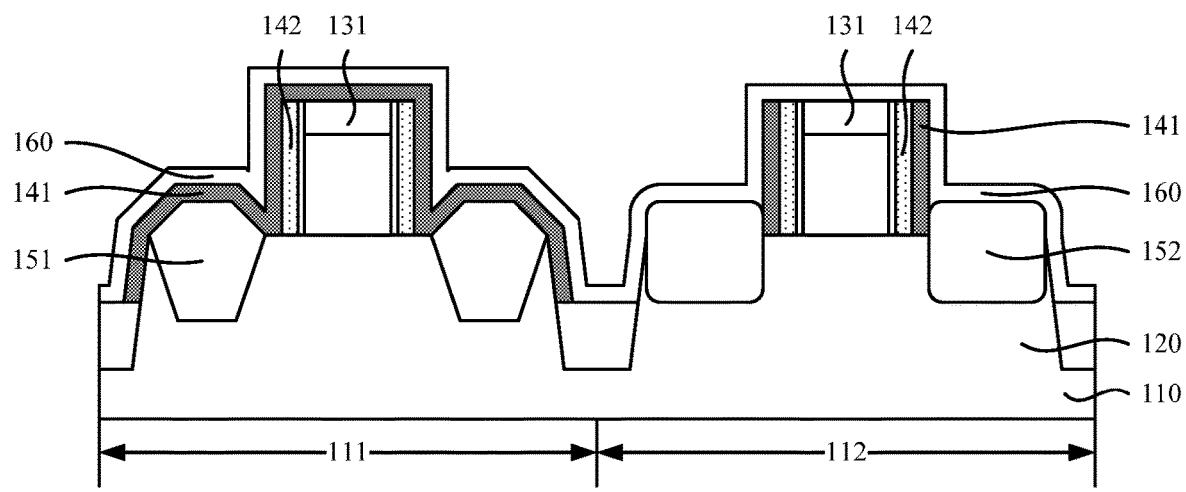

Further, a contact-hole etch stop layer may be formed on the first-region mask layer and the second stress layer (S406). FIG. 8 illustrates a schematic cross-section view of a corresponding semiconductor structure consistent with some embodiments of the present disclosure.

Referring to FIG. 8, a contact-hole etch stop layer 160 may be formed on the first-region mask layer 141 and the second stress layer 152.

The contact-hole etch stop layer 160 may be used to protect the first stress layer 152 and the second stress layer 152, and thus, during a subsequent process for forming a plurality of first contact holes and a plurality of second contact holes, damage to the first stress layer 151 and the second stress layer 152 may be prevented.

In one embodiment, the contact-hole etch stop layer 160 may be made of $SiN_x$. In other embodiments, the contact-hole etch stop layer may be made of any other appropriate material capable of providing protection and suitable for being used as a mask.

In one embodiment, the contact-hole etch stop layer 160 may be formed by an ALD process. By forming the contact-hole etch stop layer 160 through the ALD process, the formed contact-hole etch stop layer 160 may be capable of conformal coverage. In addition, the formed contact-hole etch stop layer 160 may also have a high density, and thus the protection of the contact-hole etch stop layer 160 may be improved.

In one embodiment, the contact-hole etch stop layer 160 may not only cover the first stress layer 151 and the second stress layer 152, but also cover the top and the sidewall surfaces of each first initial gate structure and each second initial gate structure. That is, on the first region 111 of the substrate 110, the contact-hole etch stop layer 160 may be formed on the first-region mask layer 141, and on the second region 112 of the substrate 110, the contact-hole etch stop layer 160 may be formed on the second stress layer 152 and the top and the sidewall surfaces of each second initial gate structure.

The thickness of the contact-hole etch stop layer 160 may not be too large or too small. When the thickness of the contact-hole etch stop layer 160 is too small, the contact-hole etch stop layer 160 may not be able to provide desired protection, which may not be conducive to reducing the damage to the first stress layer 151 and the second stress layer 152. However, an overly large thickness of the contact-hole etch stop layer 160 may cause material waste and may increase the process difficulty. In one embodiment, the thickness of the contact-hole etch stop layer 160 may be in a range of approximately 50 Å to 150 Å.

Figure 9:
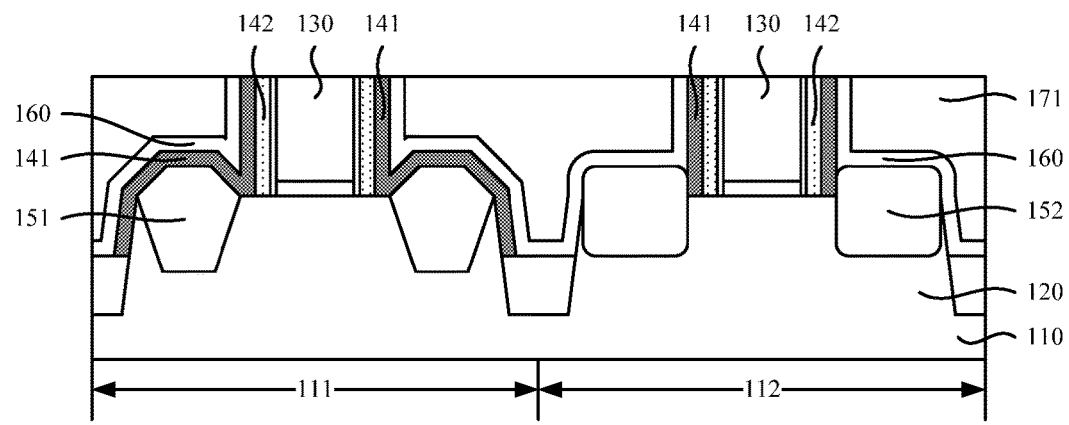

Further, returning to FIG. 17, a first dielectric layer may be formed on the contact-hole etch stop layer to fill up the space between adjacent dummy gate structures, each dummy gate structure may be removed to form a gate-structure opening, and a substitution gate structure may be formed in the gate-structure opening (S407). FIG. 9 illustrates a schematic cross-section view of a corresponding semiconductor structure consistent with some embodiments of present disclosure.

Referring to FIG. 9, after forming the contact-hole etch stop layer 160, a first dielectric layer 171 may be formed to cover the contact-hole etch stop layer 160. The first dielectric layer 171 may fill up the space between adjacent dummy gate structures 131, and may cover the first stress layer 151 and the second stress layer 152. Further, each dummy gate structure 131 may be removed to form a gate-structure opening (not shown) in the first dielectric layer 171. The gate-structure opening formed on the first region 111 above the substrate 110 may be a first gate-structure opening, and the gate-structure opening formed on the second region 112 above the substrate 110 may be a second gate-structure opening. A substitution gate structure 130 may then be formed in the gate-structure opening. In one embodiment, the top surface of the first dielectric layer 171 may be leveled with the top surface of the substitution gate structure 130.

Each substitution gate structure 130 formed on the first region 111 of the substrate 110 may be a first gate structure (i.e., the gate structure of a first type transistor), and thus may control the switch between an on state and an off state of the first type transistor. Each substitution gate structure 130 formed on the second region 112 of the substrate 110 may be a first gate structure (i.e., the gate structure of a second type transistor), and thus may control the switch between an on state and an off state of the channel of the second type transistor.

The first dielectric layer 171 may be used to form an interlayer dielectric layer to electrically isolate adjacent semiconductor structures. Moreover, the first dielectric layer 171 may also provide a process basis for forming the first gate-structure openings and the second gate-structure openings such that the size and the position of each substitution gate structure 130 may be defined.

The first dielectric layer 171 may be made of $SiO_x$. In other embodiments, the first dielectric layer 171 may be made of SiON, $SiN_x$, or any other appropriate insulating material. In one embodiment, the first dielectric layer 171 may be formed by a deposition process including one or more of chemical vapor deposition (CVD), physical vapor deposition (PVD), and ALD.

The process for forming the first dielectric layer 171 may include the following exemplary steps. A first dielectric material layer may be formed to fill the space between adjacent dummy gate structures 131. The first dielectric material layer may cover the dummy gate structures 131. The first dielectric layer 171 may be formed by performing a planarization process on the first dielectric material layer until the plurality of dummy gate structures 131 are exposed.

Further, each dummy gate structure 131 may be removed to form a gate-structure opening. The gate-structure opening formed on the first region 111 above the substrate 110 may be a first gate-structure opening, and the gate-structure opening formed on the second region 112 above the substrate 110 may be a second gate-structure opening. The gate-structure opening may be used to provide a space for subsequent formation of a substitution gate structure 130.

In one embodiment, the dummy gate structure 131 is formed across the fin structure 120. Accordingly, the bottom of each gate-structure opening may expose a portion of the top and the sidewall surfaces of the fin structure 120.

In one embodiment, the semiconductor structure to be formed may include a plurality of metal gate structures. Accordingly, the plurality of substitution gate structures 130 may be metal gate structures. Each metal gate structure may include a gate dielectric layer (not shown) and a gate electrode layer (not shown) formed on the gate dielectric layer.

The gate dielectric layer may be used to electrically isolate the channels of the fin structures 120. The gate electric layer may be made of a high-k dielectric material. The high-k dielectric material may refer to a dielectric material having a relative dielectric constant greater than the relative dielectric constant of $SiO_2$. In one embodiment, the gate dielectric layer may be made of $HfO_2$. In other embodiments, the gate dielectric layer may be made of one or more of $ZrO_2$, HfSiO, HfSiON, HfTaO, HfTiO, HfZrO, $Al_2O_3$, and any other appropriate high-k dielectric material.

In one embodiment, the bottom of each gate-structure opening may expose a portion of the top and the sidewall surfaces of the fin structure 120. Therefore, the gate dielectric layer may be formed across the fin structure 120 and may cover a portion of the top and the sidewall surfaces of the fin structure 120.

In one embodiment, the gate dielectric layer may be formed through an ALD process. In other embodiments, the gate dielectric layer may be formed by CVD, PVD, and/or any other appropriate deposition process.

The metal gate electrode may be used as an electrode to electrically connect to external circuits. In one embodiment, the metal gate electrode may be made of W. In other embodiments, the metal gate electrode may be made of one or more of Al, Cu, Ag, Au, Pt, Ni, Ti, etc.

Figure 10:
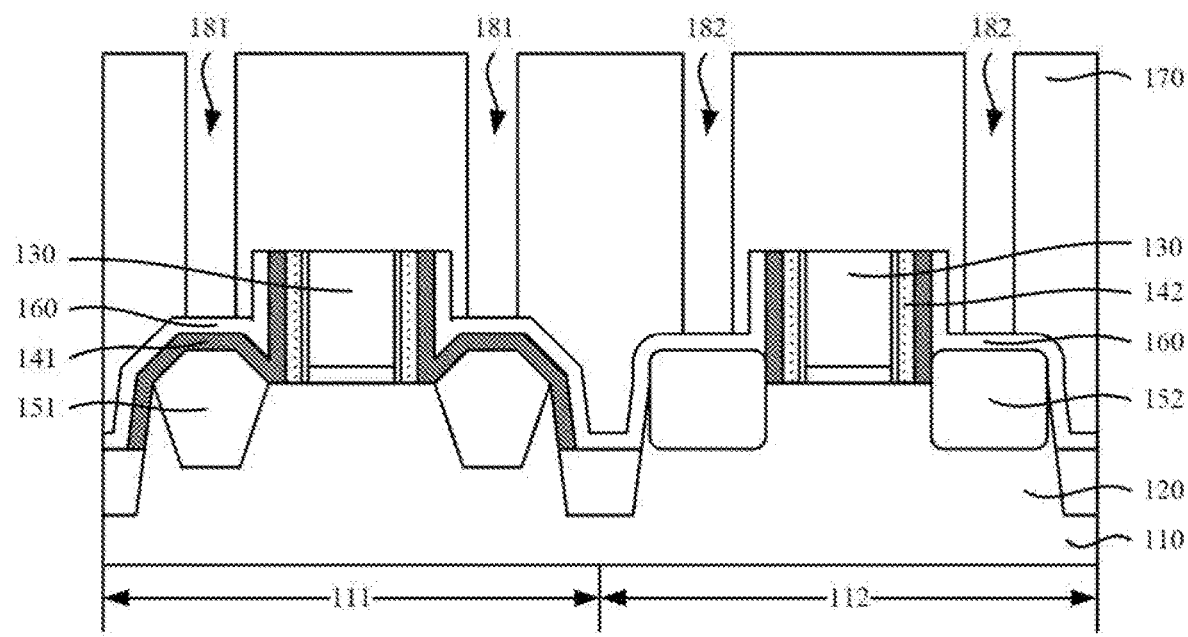

Further, returning to FIG. 17, after forming the substitution gate structures, a second dielectric layer may be formed on the first dielectric layer and the substitution gate structures, a plurality of first contact holes may be formed through the first dielectric layer and the second dielectric layer to expose a portion of the contact-hole etch stop layer formed on the first stress layer, and a plurality of second contact holes may be formed through the first dielectric layer and the second dielectric layer to expose a portion of the contact-hole etch stop layer formed on the second stress layer (S408). FIG. 10 illustrates a schematic cross-section view of a semiconductor structure consistent with some embodiments of the present disclosure.

Referring to FIG. 10, after forming the substitution gate structures, a second dielectric layer (not labeled) may be formed on the first dielectric layer 171 (referring to FIG. 9) and the substitution gate structures. The second dielectric layer and the first dielectric layer 171 may together form an interlayer dielectric layer 170.

In one embodiment, the interlayer dielectric layer 170 may fill the space between adjacent substitution gate structures 130 and cover the first stress layer 151 and the second stress layer 152. Therefore, each first contact hole 181 may be formed through the interlayer dielectric layer 170 on the first stress layer 151, and each second contact hole 182 may be formed through the interlayer dielectric layer 170 on the second stress layer 152.

For example, forming the first contact hole 181 and the second contact hole 182 may include the following steps.

The interlayer dielectric layer 170 may be etched using a masked dry etching process until the contact-hole etch stop layer 160 is exposed. Therefore, the bottom of the first contact hole 181 and the bottom of the second contact hole 182 may expose the contact-hole etch stop layer 160.

Figure 11:
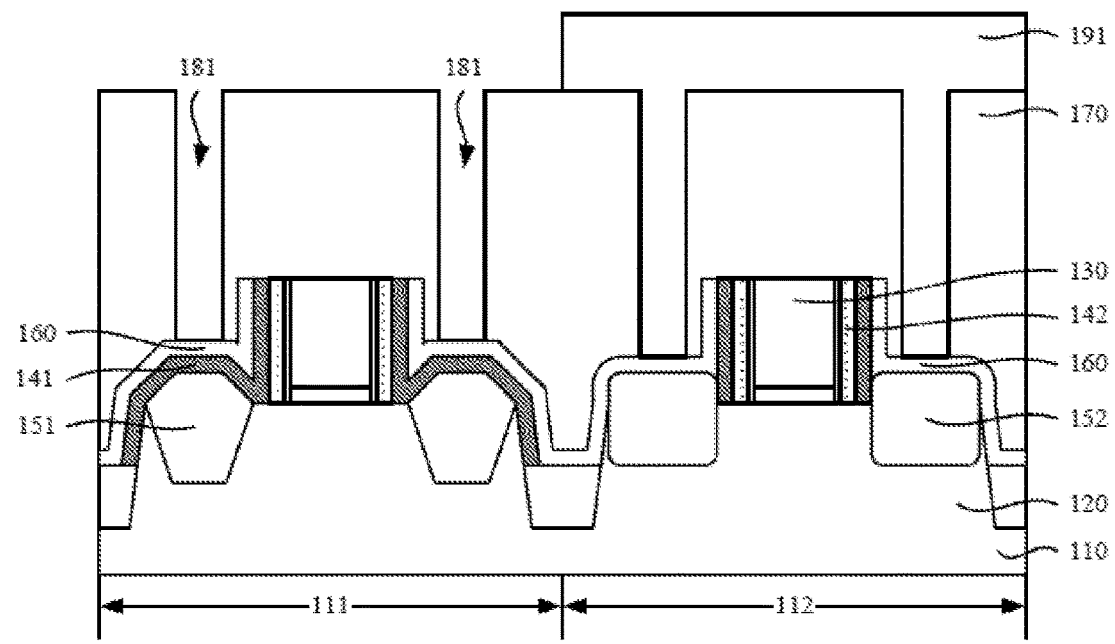

Further, returning to FIG. 17, a protection layer may be formed on the second region of the substrate (S409). FIG. 11 illustrates a schematic cross-section view of a corresponding semiconductor structure consistent with some embodiments of the present disclosure.

Referring to FIG. 11, a protection layer 191 may be formed on the second region 112 of the substrate 110. The protection layer 191 may be used to protect the semiconductor structures on the second region 112 of the substrate 110 to avoid or reduce the damage to the semiconductor structures on the second region 112 of the substrate 110 during a subsequently-performed thinning down process.

In one embodiment, the protection layer 191 may fill up each second contact hole 182 to improve the protection of protection layer 191 on the portion of the contact-hole etch stop layer 160 exposed at the bottom of the second contact hole 182. As such, damage to the portion of the contact-hole etch stop layer 160 and the second stress layer 152 may be prevented.

In one embodiment, each second contact hole 182 may be formed through the interlayer dielectric layer 170, and the top surface of the protection layer 191 may be higher than the top surface of the interlayer dielectric layer 170. Therefore, the protection layer 191 may also cove the top surface of the interlayer dielectric layer 170.

In one embodiment, the protection layer 191 may be made of a photoresist material, i.e., the protection layer 191 may be a photoresist layer. In other embodiments, the protection layer may be an organic dielectric layer or a bottom anti-reflection layer, or may have a multi-layer structure formed by an organic dielectric layer and a bottom anti-reflection layer. Forming the protection layer 191 as one or more of a photoresist layer, an organic dielectric layer, and a bottom anti-reflection layer may ensure that the protection layer 191 demonstrates desired filling ability. As such, the protection of the protection layer 191 may be improved. In addition, the protection layer 191 may also be removable when a proper method is applied, such that the residue of the protection layer may be reduced, which may be conducive to reducing undesired effects caused by the protection layer 191.

In one embodiment, the protection layer may be formed by a spin coating process.

Figure 12:
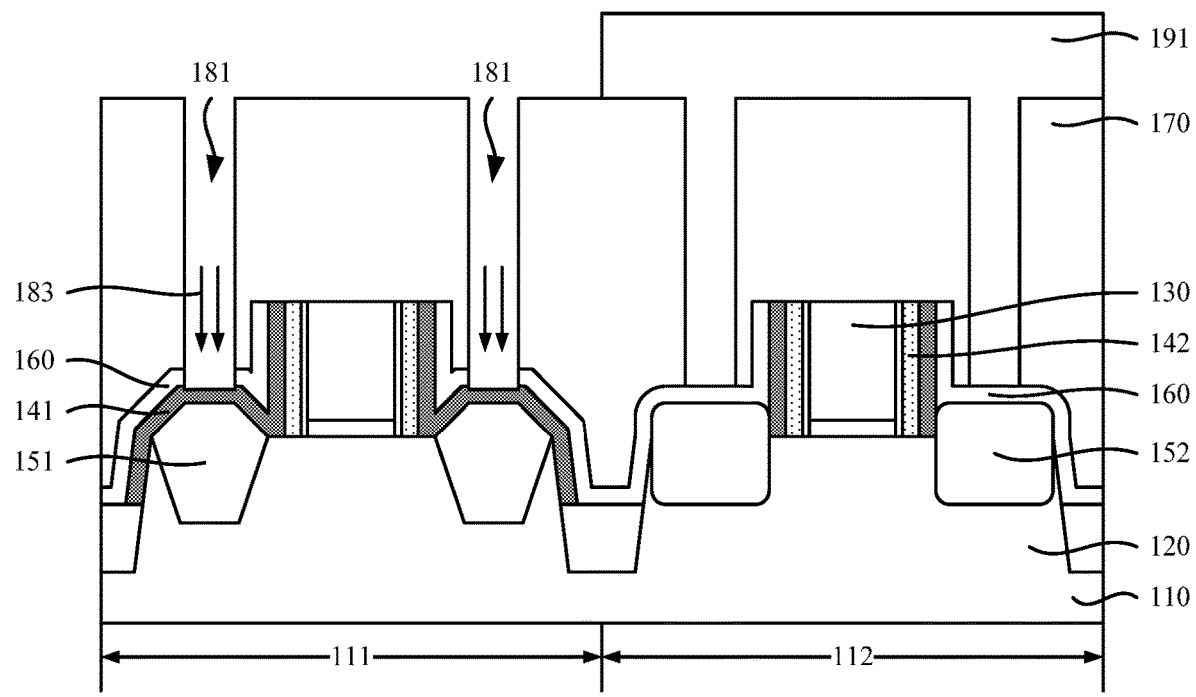

Further, returning to FIG. 17, a thinning down process may be performed along the depth direction of each first contact hole to remove a portion of the contact-hole etch stop layer formed on the first stress layer (S410). FIG. 12 illustrates a schematic cross-section view of a corresponding semiconductor structure.

Referring to FIG. 12, a thinning down process 183 may be performed along the depth direction of each first contact hole 181 to remove a portion of the contact-hole etch stop layer 160 formed on the first stress layer 151.

In one embodiment, because the first-region mask layer 141 and the contact-hole mask layer 160 are formed on the first stress layer 151, and only the contact-hole mask layer 160 is formed on the second stress layer 152, the thickness of the material layer on the second stress layer 152 may be larger than the thickness of the material layer on the first stress layer 151. The thinning down process 183 may be used to remove a portion of the contact-hole etch stop layer 160 formed on the first stress layer 151 so that the thickness of the material layer formed on the first stress layer 151 may be reduced. As such, the thickness of the material layer formed on the first stress layer 151 may be comparable with the thickness of the material layer formed on the second tress layer 152.

Because the thinning down process 183 is performed along the depth direction of each first contact hole 181, only the portion of the first-region mask layer 141 exposed by the first contact hole 181 may be thinned down. The portion of the first-region mask layer 141 covered by the interlayer dielectric layer 170 and thus not exposed by the first contact hole 181 may not be affected by the thinning down process. That is, after the thinning down process 183, the thickness of the portion of the contact-hole etch stop layer 160 exposed at the bottom of the first contact hole 181 may be smaller than the thickness of the portion of the contact-hole etch stop layer covered by the interlayer dielectric layer 170.

In one embodiment, after forming the protection layer 191, the subsequently-performed thinning down process 183 may include dry etching. For example, the contact-hole etch stop layer 160 and the first-region mask layer 141 may be made of $SiN_x$, and accordingly, the process parameters used in the thinning down process may include an etch gas including $CH_2F_2$, $O_2$, and $CF_4$; a flow rate of $CH_2F_2$ in a range of approximately 8 sccm to 50 sccm; a flow rate of $O_2$ in a range of approximately 2 sccm to 30 sccm; a flow rate of $CF_4$ in a range of approximately 30 sccm to 200 sccm; an radio frequency (RF) power in a range of approximately 100 W to 1000 W; a voltage in a range of approximately 30 V to 500 V; an etch time in a range of approximately 4 s to 500 s; and a pressure in a range of approximately 10 mTorr to 2000 mTorr.

The amount of the material layer removed in the thinning down process 183 may not be too large or too small. When the removed amount in the thinning down process 183 is too large, the thickness of the remaining material layer on the first stress layer 151 may be too small, which may not be conducive to providing protection for the first stress layer 151, and thus damage to the first stress layer 151 may be increased. When the removed amount in the thinning down process 183 is too small, the thickness of the removed material layer may be too small, which may not be conducive to reducing the thickness of the material layer on the first stress layer 151. As such, the risk of damaging the second stress layer 152 in a subsequent process may be increased. In one embodiment, the thickness of the removed portion of the material layer on the first stress layer 151 may be in a range of approximately 30 Å to 2000 Å.

In one embodiment, the objective of the thinning down process 183 is to make the thickness of the material layer on the first stress layer 151 comparable with the thickness of the material layer on the second stress layer 152 such that damage to the second stress layer 152 in the fabrication process may be reduced or suppressed. Therefore, the removed amount in the thinning down process 183 may be determined by the thickness difference between the material layer on the first stress layer 151 and the material layer on the second stress layer 152. For example, the removed amount in the thinning down process 183 may be determined by the difference between the total thickness of the first-region mask layer 141 and the contact-hole etch stop layer 160 on the first stress layer 151 and the thickness of the contact-hole etch stop layer 160 on the second stress layer 152.

As shown in FIG. 12, in addition to removing the portion of the contact-hole etch stop layer 160 formed on the first stress layer 151 and exposed by each first contact hole 181, the thinning down process 183 may also remove a top portion of the first-region mask layer 141 at the bottom of each first contact hole 181. Therefore, after the thinning down process 183, the bottom of each first contact hole 181 may expose the first-region mask layer 141 formed on the first stress layer 151. Therefore, after the thinning down process 183, the thickness of the portion of the contact-hole etch stop layer 160 exposed by each contact hole 181 may be reduced to zero.

In one embodiment, the removed amount in the thinning down process 183 may be determined by the thickness of the first-region mask layer 141 and the thickness of the contact-hole etch stop layer 160. By properly determining the amount to be removed in the thinning down process 183, the thickness of the material layer on the first stress layer 151 at the bottom of each first contact hole 181 may be comparable with the thickness of the material layer on the second stress layer 152 at the bottom of each second contact hole 182 after the thinning down process 183.

Figure 13:
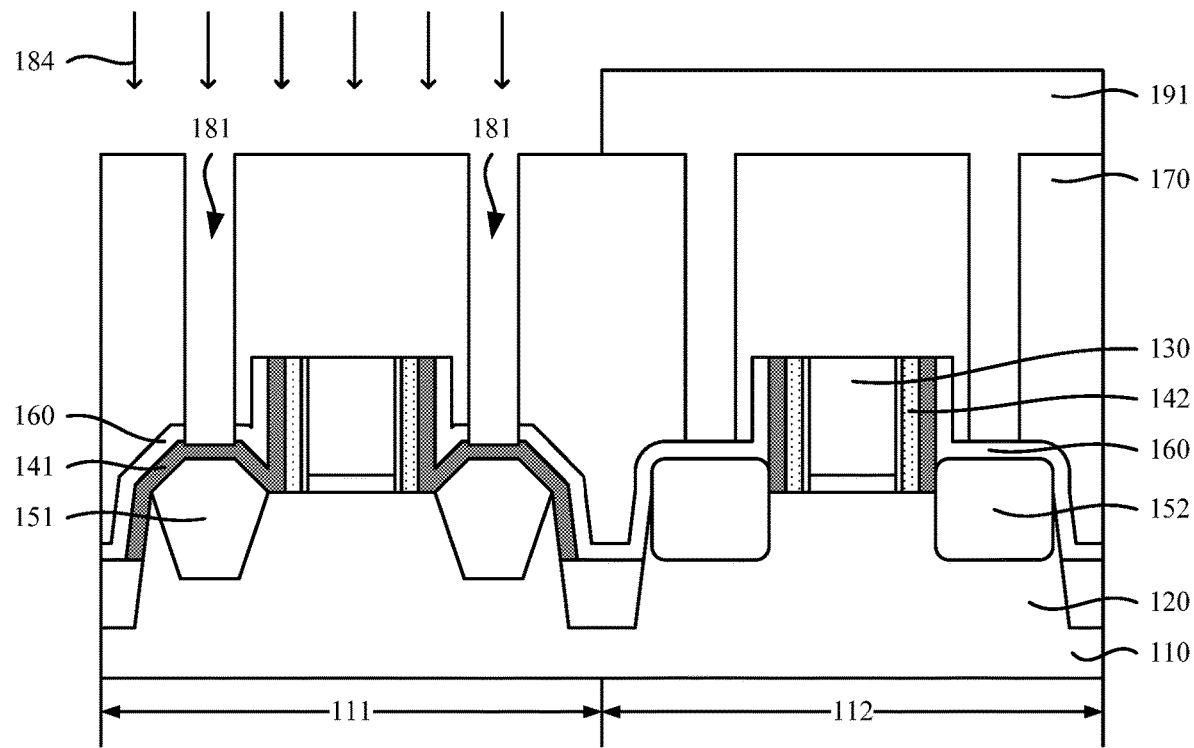

Further, returning to FIG. 17, after performing the thinning down process, a contact implantation process may be performed on the portion of the first stress layer exposed at the bottom of each first contact hole using the protection layer as a mask (S411). FIG. 13 illustrates a schematic diagram of the contact implantation process consistent with some embodiments of the present disclosure.

Referring to FIG. 13, after performing the thinning down process 183 (referring to FIG. 12), a contact implantation process 184 may be performed to form a highly-doped region in the first stress layer 151 to reduce the contact resistance between the first stress layer 151 and a subsequently-formed first plug. As such the performance of the formed semiconductor structure may be improved.

In one embodiment, the contact implantation process 184 may be performed on the portion of the first stress layer 151 exposed at the bottom of each first contact hole 181 using the protection layer 191 as a mask.

The protection layer 191 may be used as the mask for the contact implantation process 184. Therefore, the protection layer 191 may not only serve as the mask during the thinning down process 183 (referring to FIG. 12) to protect the semiconductor structures on the first region 111 of the substrate 110, but also serve as the mask during the contact implantation process 184 to protect the semiconductor structures on the first region 111 of the substrate 110 such that the semiconductor structures on the first region 111 of the substrate 110 may not be affected by the contact implantation process 184.

Moreover, using the protection layer 191 in both the contact implantation process 184 and the thinning down process 183 may effectively reduce the use of masks, which may be conducive to reducing the process cost. In addition, using the protection layer 191 in both the contact implantation process 184 and the thinning down process 183 may also be able to avoid the alignment issue due to multiple times of the use of masks, and thus may be conducive to improving the process precision and yield.

In one embodiment, the contact implantation process 184 may be performed after the completion of the thinning down process 183. Therefore, the thickness of the material layer on the first stress layer 151 may be small. A small thickness of the material layer formed on the first stress layer 151 may be able to effectively reduce the process difficulty of the contact implantation process. For example, the implantation energy of the contact implantation process 184 may be reduced. The reduction of the process difficulty of the contact implantation process 184 may be able to effectively reduce the influence of the contact implantation process 184 on the first stress layer 151, and thus may reduce the damage to the first stress layer 151. As such, the performance of the formed semiconductor structure may be improved.

Figure 14:
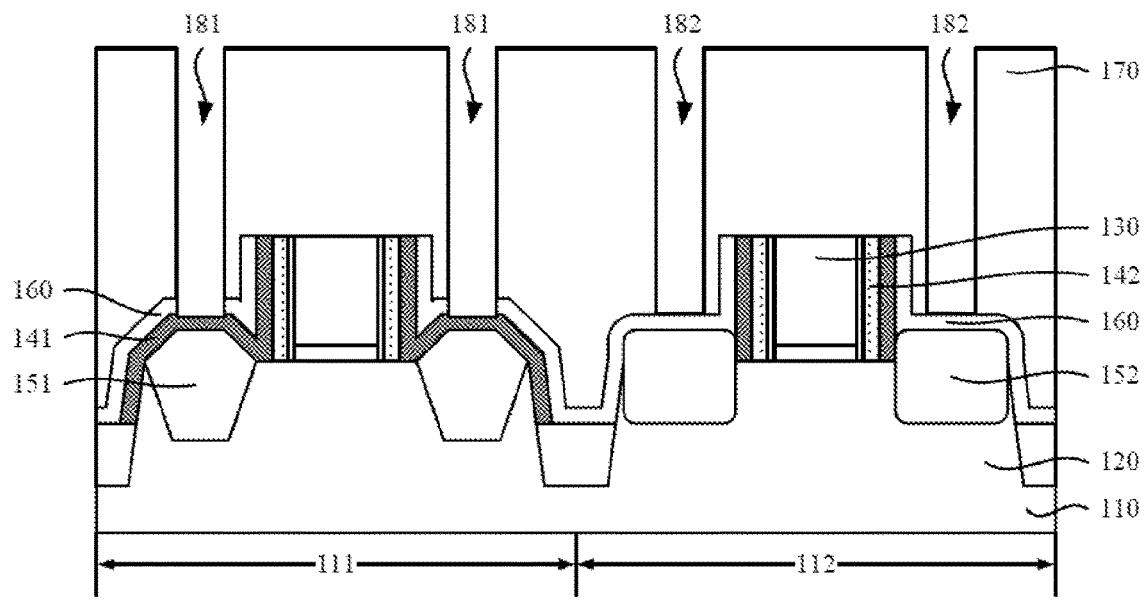

Further, returning to FIG. 17, after performing the contact implantation process, the protection layer may be removed to expose each second contact hole (S412). FIG. 14 illustrates a schematic cross-section view of a corresponding semiconductor structure consistent with some embodiments of the present disclosure.

Referring to FIG. 14, after performing the contact implantation process 184 (referring to FIG. 13), the protection layer 191 (referring to FIG. 13) may be removed to expose each second contact hole 182. The exposure of the second contact hole 182 may provide a process space for forming a second plug in a subsequent process.

In one embodiment, the protection layer 191 is a photoresist layer. An etching process may be performed to remove the protection layer 191. The process parameters used for removing the protection layer 191 may include a process pressure in a range of approximately 500 mTorr to 2000 mTorr, a power in a range of approximately 1000 W to 2700 W, an etch gas including $N_2$ and $H_2$, a flow rate of $N_2$ in a range of approximately 1000 sccm to 4000 sccm, a flow rate of $H_2$ in a range of approximately 500 sccm to 3000 sccm, and a process temperature in a range of approximately 120° C. to 450° C.

In one embodiment, the contact-hole etch stop layer 160 is formed on the second stress layer 153, and thus after removing the protection layer 191, the contact-hole etch stop layer 160 formed on the second stress layer 152 may be partially exposed at the bottom of each second contact hole 182.

Further, returning to FIG. 17, the portion of the first-region mask layer exposed at the bottom of each first contact hole and the portion of the contact-hole etch stop layer exposed at the bottom of each second contact hole may be removed to expose the first stress layer and the second stress layer, respectively (S413). FIG. 15 illustrates a schematic cross-section view of a corresponding semiconductor structure consistent with some embodiments of the present disclosure.

Referring to FIG. 15, after removing the protection layer 191 formed on the second region 112 of the substrate 110, the portion of the first-region mask layer 141 at the bottom of each first contact hole 181 may be removed to expose the first stress layer 151. In addition, the portion of the contact-hole etch stop layer 160 at the bottom of each second contact hole 182 may also be removed to expose the second stress layer 152.

In one embodiment, removing the portion of the first-region mask layer 141 at the bottom of each first contact hole 181 and the portion of the contact-hole etch stop layer 160 at the bottom of each second contact hole 182 may be used to expose the first stress layer 151 and the second stress layer 152, and thus provide a process basis for forming a first plug and a second plug in a subsequent process to electrically connect the first stress layer 151 and the second stress layer 152, respectively.

In one embodiment, the first-region mask layer 141 exposed at the bottom of each first contact hole 181 and the contact-hole etch stop layer 160 at the bottom of each second contact hole 182 may be removed after performing the thinning down process 183 (referring to FIG. 12). Therefore, the thickness of the remaining portion of the material layer on the first stress layer 151 may be similar to the thickness of the material layer on the second stress layer 152, and thus, the etching amount for removing the first-region mask layer 141 may be similar to the etching amount for removing the contact-hole etch stop layer 160. As such, the process difficulty during removing the first-region mask layer 141 and the contact-hole etch stop layer 160 may be effectively reduced. Therefore, damage to the second stress layer 152 when removing the first-region mask layer 141 and the contact-hole etch stop layer may be suppressed, which may be conducive to improving the performance of the formed semiconductor structure.

In one embodiment, during the thinning down process 183, the portion of the contact-hole etch stop layer 160 on the first stress layer 151 at the bottom of each first contact hole 161 may be fully removed. Therefore, the bottom of the first contact hole 181 may expose the first-region mask layer 141 formed on the first stress layer 151. As such, during the process for removing the first-region mask layer 141 and the contact-hole etch stop layer 160, the remaining portion of the first-region mask layer 141 at the bottom of the first contact hole 181 may be removed along the depth direction of the first contact hole 181 to expose the first stress layer 151.

In other embodiments, during the thinning down process, the contact-hole etch stop layer may be partially removed. That is, the remaining portion of the contact-hole etch stop layer may be exposed at the bottom of each first contact hole. Therefore, during the process for removing the first-region mask layer and the contact-hole etch stop layer, the portion of the first-region mask layer and the remaining portion of the contact-hole etch stop layer at the bottom of each first contact hole may be removed along the depth direction of the first contact hole to expose the first stress layer.

In one embodiment, the contact-hole etch stop layer 160 and the first-region mask layer 141 may both be made of $SiN_x$. Accordingly, a dry etching process may be adopted to remove the portion of the first-region mask layer 141 at the bottom of each first contact hole 181 and the portion of the contact-hole etch stop layer 160 at the bottom of each second contact hole 182. For example, the process parameters used in the dry etching process may include an etch gas including $CH_2F_2$, $O_2$, and $CF_4$; a flow rate of $CH_2F_2$ in a range of approximately 8 sccm to 50 sccm; a flow rate of $O_2$ in a range of approximately 2 sccm to 30 sccm; a flow rate of $CF_4$ in a range of approximately 30 sccm to 200 sccm; an RF power in a range of approximately 100 W to 1000 W; a voltage in a range of 30 V to 500 V; a process time in a range of approximately 4 s to 500 s, and a process pressure in a range of 10 mTorr to 2000 mTorr.

Further, returning to FIG. 17, a first plug may be formed in each first contact hole and a second plug may be formed in each second contact hole (S414). FIG. 16 illustrates a schematic cross-section view of a corresponding semiconductor structure consistent with some embodiments of the present disclosure.

Referring to FIG. 16, a first plug 193 may be formed in each first contact hole 181, and a second plug 192 may be formed in each second contact hole 182.

The first plug 193 may be electrically connected to the first stress layer 151 such that through the first plug 193, the first stress layer 151 and the external circuits may be connected to each other. The second plug 192 may be electrically connected to the second stress layer 152 such that through the second plug 192, the second stress layer 152 and the external circuits may be connected to each other.

In one embodiment, the first plug 193 and the second plug 192 may be made of W. For example, the first plug 193 the second plug 192 may be formed by a process including the following exemplary steps. A conductive material may be filled into each first contact hole 181 and each second contact hole 182. The conductive material may also cover the interlayer dielectric layer 170. The portion of the conductive material formed above the top surface of the interlayer dielectric layer 170 may be removed to form the first plug 193 and the second plug 192.

The detailed fabrication process for forming the first plug 193 and the second plug 192 may be any appropriate process according to the existing technology.

The present disclosure also provides a semiconductor structure. FIG. 13 illustrates a schematic cross-section view of an exemplary semiconductor structure consistent with some embodiments of the present disclosure.

Referring to FIG. 13, the semiconductor structure may include a substrate 110 including a first region 111 and a second region 112. A plurality of first type transistors may be formed on the first region 111 and a plurality of second type transistors may be formed on the second region 112. The semiconductor structure may also include a plurality of substitution gate structures 130 formed on the substrate 110. Each first type transistor or each second type transistor may include a substitution gate structure 130. In one embodiment, the substitution gate structure 130 formed on the first region 111 of the substrate 110 may be a first gate structure, and the substitution gate structure 130 formed on the second region 112 of the substrate 110 may be a second gate structure. For illustrative purposes, only one first type transistor and one second type transistor are shown in FIG. 13.

The semiconductor structure may also include a first stress layer 151 formed in the substrate 110 on both sides of each first gate structure, a second stress layer 152 formed in the substrate 110 on both sides of each second gate structure, a first-region mask layer 141 covering at least the first stress layer 151, a contact-hole etch stop layer 160 covering at least a portion of the first-region mask layer 141 and the second stress layer 152, and an interlayer dielectric layer 170 formed above the first stress layer 151 and the second stress layer 152.

The semiconductor structure may also include a plurality of first contact holes 181 formed through the interlayer dielectric layer 170 above the first stress layer 151. In one embodiment, each first contact hole 181 may also be formed through the contact-hole etch stop layer 160, and thus a portion of the first-region mask layer 141 formed on the first stress layer 151 may be exposed at the bottom of the first contact hole 181. That is, the thickness of the portion of the contact-hole etch stop layer 160 located at the bottom of the first contact hole 181 may be zero. Therefore, the thickness of the portion of the contact-hole etch stop layer 160 at the bottom of the first contact hole 181 may be smaller than the thickness of the contact-hole etch stop layer 160 between the interlayer dielectric layer 170 and the first stress layer 151.

Moreover, the semiconductor structure may also include a plurality of second contact holes (not labeled) formed through the interlayer dielectric layer 170. A portion of the contact-hole etch stop layer 160 formed on the second stress layer 252 may be exposed at the bottom of each second contact hole.

In one embodiment, the first stress layer 151 may be used to form a source/drain doped region of a first type transistor. The first stress layer 151 may induce stress into the channel region under each first gate structure formed on the first region 111 of the substrate 110 to improve the mobility of the carriers in the channel. In one embodiment, the semiconductor structure also includes a plurality of fin structures 120 formed on the first region 111. That is, a plurality of discrete fin structures 120 may be formed on the first region 111 of the substrate 110. Accordingly, the first stress layer 151 may be formed in a corresponding fin structure 120 on both sides of the first gate structure.

In one embodiment, the plurality of first type transistors may be a plurality of PMOS transistors. Accordingly, the first stress layer 151 may be a stress layer doped with P-type ions. In one embodiment, the first stress layer 151 may be made of SiGe or Si, and doped with P-type ions, such as B ions, Ga ions, and/or In ions.

In one embodiment, the second stress layer 152 may be used to form a source/drain doped region of a second type transistor. The second stress layer 152 may induce stress into the channel region under each second gate structure formed on the second region 112 of the substrate 110 to improve the mobility of the carriers in the channel. In one embodiment, the semiconductor structure also includes a plurality of fin structures 120 formed on the second region 112. That is, a plurality of discrete fin structures 120 may be formed on the second region 112 of the substrate 110. Accordingly, the second stress layer 152 may be formed in a corresponding fin structure 120 on both sides of the second gate structure.

In one embodiment, the plurality of second type transistors may be a plurality of NMOS transistors. Accordingly, the second stress layer 152 may be a stress layer doped with N-type ions. In one embodiment, the second stress layer 152 may be made of SiC or Si, and doped with N-type ions, such as P ions, As ions, and/or Sb ions.

In one embodiment, the first-region mask layer 141 may be formed on the first stress layer 151. Forming the first-region mask layer 141 on the first stress layer 151 may provide protection for the first stress layer 151. For example, during a subsequent process for forming a second stress layer, the first-region mask layer 141 may prevent damage to the first stress layer 151.

In one embodiment, the first-region mask layer 141 may not only cover the surface of the first stress layer 151, but also cover the sidewall surfaces of each first gate structure and each second gate structure.

In one embodiment, the first-region mask layer 141 may be made of $SiN_x$. In other embodiments, the first-region mask layer may be made of any other appropriate material that is capable of providing protection and suitable for being used as a mask.

The thickness of the first-region mask layer 141 may not be too large or too small. When the thickness of the first-region mask layer 141 is too small, the first-region mask layer 141 may not be able to provide desired protection such that damage to the first stress layer 151 may be increased, which may not be conducive to improving the manufacturing yield and the device performance. However, an overly large thickness of the first-region mask layer 141 may cause material waste and may increase the process difficulty. In one embodiment, the thickness of the first-region mask layer 141 may be in a range of approximately 50 Å to 120 Å.

The contact-hole etch stop layer 160 may be used to protect the first stress layer 152 and the second stress layer 152, and thus, during a subsequent process for forming a plurality of first contact holes and a plurality of second contact holes, damage to the first stress layer 151 and the second stress layer 152 may be prevented.

In one embodiment, the contact-hole etch stop layer 160 may not only cover the first stress layer 151 and the second stress layer 152, but also cover the sidewall surfaces of each first gate structure and each second gate structure.

In one embodiment, the contact-hole etch stop layer 160 may be made of $SiN_x$. In other embodiments, the contact-hole etch stop layer may be made of any other appropriate material capable of providing protection and suitable for being used as a mask.

The thickness of the contact-hole etch stop layer 160 may not be too large or too small. When the thickness of the contact-hole etch stop layer 160 is too small, the contact-hole etch stop layer 160 may not be able to provide desired protection, which may not be conducive to reducing the damage to the first stress layer 151 and the second stress layer 152. However, an overly large thickness of the contact-hole etch stop layer 160 may cause material waste and may increase the process difficulty. In one embodiment, the thickness of the contact-hole etch stop layer 160 may be in a range of approximately 50 Å to 150 Å.

In one embodiment, the interlayer dielectric layer 170 may be used to electrically isolate different semiconductor structures. The interlayer dielectric layer 170 may be made of $SiO_x$. In other embodiments, the interlayer dielectric layer 170 may be made of SiON, $SiN_x$, or any other appropriate insulating material.

In one embodiment, the plurality of first contact holes 181 and the plurality of second contact holes (not labeled) may be used to provide a process space for subsequently-formed first plugs and second plugs.

In one embodiment, the interlayer dielectric layer 170 may be formed on the first stress layer 151 and the second stress layer 152 and may fill up the space between adjacent substitution gate structures 130. Therefore, the first contact hole 181 may be formed through the portion of the interlayer dielectric layer 170 on the first stress layer 151, and the second contact hole may be formed through the portion of the interlayer dielectric layer 170 on the second stress layer 152.

In one embodiment, the portion of the contact-hole etch stop layer 160 exposed at the bottom of each first contact hole 181 may be thinned down, and the first-region mask layer 141 covered by the interlayer dielectric layer 170 may not be affected when thinning down the portion of the contact-hole etch stop layer 160 exposed at the bottom of each first contact hole 181. Therefore, the thickness of the portion of the contact-hole etch stop layer 160 at the bottom of each first contact hole 181 may be smaller than the thickness of the portion of the contact-hole etch stop layer 160 covered by the interlayer dielectric layer 170.

In one embodiment, because the thickness of the portion of the first-region mask layer 141 formed on the first stress layer 151 is reduced by a thinning down process, the thickness of the material layer on the first stress layer 151 may be smaller as compared to that according to the existing technology. As such, the thickness of the material layer on the first stress layer 151 may be comparable with the thickness of the material layer on the second stress layer 152.

Because the thickness of the material layer on the first stress layer 151 is similar to the thickness of the material layer on the second stress layer 152, the etching amount for removing the first-region mask layer 141 at the bottom of each first contact hole 181 may be similar to the etching amount for removing the contact-hole etch stop layer 160 at the bottom of each second contact hole. As such, the process difficulty during removing the first-region mask layer 141 and the contact-hole etch stop layer 160 may be effectively reduced. Therefore, damage to the second stress layer 152 when removing the first-region mask layer 141 and the contact-hole etch stop layer may be suppressed, which may be conducive to improving the performance of the formed semiconductor structure.

In one embodiment, the thickness difference between the portion of the contact-hole etch stop layer 160 at the bottom of each first contact hole 181 and the portion of the contact-hole etch stop layer 160 between the first stress layer 151 and the interlayer dielectric layer 170 may be in a range of approximately 20 Å to 120 Å.

A small thickness difference between the portion of the contact-hole etch stop layer 160 at the bottom of each first contact hole 181 and the portion of the contact-hole etch stop layer 160 between the first stress layer 151 and the interlayer dielectric layer 170 may not be conducive to reducing the thickness of the material layer on the first stress layer 151. As such, the risk of damaging the second stress layer 152 in a subsequent process may be increased.

In one embodiment, the etching amount in the thinning down process is determined according to the thickness difference between the material layer on the first stress layer 151 and the material layer on the second stress layer 152. Therefore, the thinning down process may remove the contact-hole etch stop layer 160 at the bottom of each first contact hole 181, and may even remove a portion of the first-region mask layer 141 at the bottom of each first contact hole 181. As such, the thickness of the portion of the contact-hole etch stop layer 160 at the bottom of each first contact hole 181 may be smaller than or equal to the portion of the first-region mask layer 141 between the interlayer dielectric layer 170 and the first stress layer 151.

In one embodiment, by properly determining the amount to be removed in the thinning down process based on the thickness of the first-region mask layer 141 and the thickness of the contact-hole etch stop layer 160 such that the thickness of the material layer on the first stress layer 151 at the bottom of each first contact hole 181 may be comparable with the thickness of the material layer on the second stress layer 152 at the bottom of each second contact hole 182 after the thinning down process.

In one embodiment, as shown in FIG. 13, the entire portion of contact-hole etch stop layer 160 at the bottom of the first contact hole 181 together with a portion of the first-region mask layer 141 at the bottom of the first contact hole 181 may be removed to ensure that the thickness of the material layer on the first stress layer 151 is comparable to the thickness of the material layer on the second stress layer 152. As such, the first-region mask layer may be exposed at the bottom of each first contact hole 181. In addition, the thickness of the portion of the first-region mask layer 141 exposed at the bottom of the first contact hole 181 may be smaller than the thickness of the portion of the first-region mask layer 141 between the interlayer dielectric layer 170 and the first stress layer 151.

In other embodiments, the portion of the contact-hole etch stop layer at the bottom of the first contact hole may not be fully removed, and thus the remaining portion of the contact-hole etch stop layer may be exposed at the bottom of the first contact hole.

Further, referring to FIG. 13, in one embodiment, the semiconductor structure may also include a protection layer 191 formed on the second region 112 of the substrate 110.

The protection layer 191 may be used to protect the semiconductor structures on the second region 112 of the substrate 110 to avoid or reduce the damage to the semiconductor structures on the second region 112 of the substrate 110 during the thinning down process.

In one embodiment, the protection layer 191 may fill up each second contact hole improve the protection of protection layer 191 on the portion of the contact-hole etch stop layer 160 exposed at the bottom of the second contact hole 182. As such, damage to the portion of the contact-hole etch stop layer 160 and the second stress layer 152 may be prevented.

In one embodiment, each second contact hole 182 may be formed through the interlayer dielectric layer 170, and the top surface of the protection layer 191 may be higher than the top surface of the interlayer dielectric layer 170. Therefore, the protection layer 191 may also cove the top surface of the interlayer dielectric layer 170.

In one embodiment, the protection layer 191 may be made of a photoresist material, i.e., the protection layer 191 may be a photoresist layer. In other embodiments, the protection layer may be an organic dielectric layer or a bottom anti-reflection layer, or may have a multi-layer structure formed by an organic dielectric layer and a bottom anti-reflection layer. Forming the protection layer 191 as one or more of a photoresist layer, an organic dielectric layer, and a bottom anti-reflection layer may ensure that the protection layer 191 demonstrates desired filling ability. As such, the protection of the protection layer 191 may be improved. In addition, the protection layer 191 may also be removable when a proper method is applied, such that the residue of the protection layer may be reduced, which may be conducive to reducing undesired effects caused by the protection layer 191.

Moreover, in one embodiment, a highly-doped region may be formed in the first stress layer 151 to reduce the contact resistance between the first stress layer 151 and a subsequently formed first plug. As such, the performance of the semiconductor structure may be improved. The protection layer 191 may also be used as a mask to protect the semiconductor structures on the first region 111 of the substrate 110 during the process for forming the highly-doped region. As such, the semiconductor structures on the first region 111 of the substrate 110 may not be affected during the process for forming the highly-doped region.

In one embodiment, referring to FIG. 16, the semiconductor structure may further include a first plug 193 formed in each first contact hole 181 (referring to FIG. 13), and a second plug 192 formed in each second contact hole. The first plug 193 and the second plug 192 may be made of W.

The first plug 193 may be electrically connected to the first stress layer 151 such that through the first plug 193, the first stress layer 151 and the external circuits may be connected to each other. The second plug 192 may be electrically connected to the second stress layer 152 such that through the second plug 192, the second stress layer 152 and the external circuits may be connected to each other.

The disclosed semiconductor structure may be formed by the method described in the above embodiments. The detailed process for fabricating the semiconductor structure may be referred to the corresponding description of the disclosed method.

According to the disclosed semiconductor structure and fabrication method, the etching amount of the first-region mask layer at the bottom of the first contact hole may be comparable with the etching amount of the contact-hole etch stop layer after the thinning down process. As such, damage to the second stress layer may be reduced, which may be conducive to reducing the process difficulty. Therefore, the product yield may be improved, and the device performance may be improved.

Compared to conventional semiconductor structures and fabrication methods, the disclosed semiconductor structures and fabrication methods may demonstrate the following advantages.

According to the disclosed semiconductor structures and fabrication methods, after forming the plurality of first contact holes and the plurality of second contact holes, a thinning down process is performed along the depth direction of each first contact hole to at least remove a portion of the contact-hole etch stop layer on the first stress layer. After performing the thinning down process, the total thickness of the remaining portion of the contact-hole etch stop layer and the first-region mask layer at the bottom of the first contact hole may be comparable with the thickness of the contact-hole etch stop layer at the bottom of the second contact hole. Therefore, the etching amount of the first-region mask layer at the bottom of the first contact hole may be comparable with the etching amount of the contact-hole etch stop layer at the bottom of the second contact hole. As such, damage to the second stress layer may be reduced, which may be conducive to reducing the process difficulty. Therefore, the product yield may be improved, and the device performance may be improved.

According to the disclosed semiconductor structure and fabrication method, a protection layer may be formed on the second region of the substrate prior to performing the thinning down process. The protection layer is able to provide protection for the contact-hole etch stop layer at the bottom of each second contact hole during the thinning down process such that the thinning down process may not affect the contact-hole etch stop layer at the bottom of each second contact hole. As such, the product yield may be improved, and the process control may also be improved.

According to the disclosed semiconductor structure and fabrication method, after performing the thinning down process and prior to removing the protection layer, a contact implantation process may be performed on the first stress layer along the depth direction of each first contact hole. Therefore, only a single protection layer needs to be formed for the thinning down process and the contact implantation process, and thus the use of masks may be effectively reduced, which may be conducive to reducing the product cost and limiting process risk. In addition, because the portion of the first-region mask layer on the first stress layer is thinned down, that is, the thickness of the portion of the first-region mask layer on the first stress layer is small. A small thickness of the portion of the first-region mask layer on the first stress layer may be able to effectively reduce the process difficulty of the contact implantation process. The implantation energy of the contact implantation process may be reduced. The reduction of the process difficulty of the contact implantation process may be able to effectively reduce the influence of the contact implantation process on the first stress layer, and thus may reduce the damage to the first stress layer. As such, the yield and the performance of the semiconductor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate, including a first region and a second region;
   forming a plurality of first gate structures on the first region of the substrate, a plurality of second gate structures on the second region of the substrate, and a first stress layer in the substrate on both sides of each first gate structure;
   forming a first-region mask layer on the first stress layer;
   forming a second stress layer in the substrate on both sides of each second gate structure using the first-region mask layer as a mask;
   forming a contact-hole etch stop layer on the first stress layer and on the second stress layer;
   forming a plurality of first contact holes on the first stress layer and a plurality of second contact holes on the second stress layer, wherein the contact-hole etch stop layer formed on the first stress layer is exposed at a bottom of each first contact hole, and the contact-hole etch stop layer formed on the second stress layer is exposed at a bottom of each second contact hole;
   removing at least a portion of the contact-hole etch stop layer exposed at the bottom of each first contact hole, wherein a sum of a thickness of a remaining portion of the contact-hole etch stop layer and a thickness of the first-region mask layer equals at the bottom of each first contact hole approximately to a thickness of the contact-hole etch stop layer at the bottom of each second contact hole; and
   removing the first-region mask layer at the bottom of each first contact hole and the contact-hole etch stop layer at the bottom of each second contact hole to expose the first stress layer and the second stress layer, respectively.

2. The method according to claim 1, wherein:
the thinning down process includes dry etching.

3. The method according to claim 1, wherein:
a thickness of the at least a portion of the contact-hole etch stop layer removed is in a range of approximately 30 Å to 200 Å.

4. The method according to claim 1, wherein:
the contact-hole etch stop layer exposed at the bottom of each first contact hole is fully removed.

5. The method according to claim 4, wherein:
the contact-hole etch stop layer exposed at the bottom of each first contact hole and a top portion of the first-region mask layer formed at the bottom of each first contact hole are removed.

6. The method according to claim 1, wherein:
the first-region mask layer at the bottom of each first contact hole and the contact-hole etch stop layer at the bottom of each second contact hole to expose the first stress layer and the second stress layer is removed, respectively, after removing at least a portion of the contact-hole etch stop layer exposed at the bottom of each first contact hole.

7. A method for fabricating a semiconductor structure, comprising:
   providing a substrate, including a first region and a second region;
   forming a plurality of first gate structures on the first region of the substrate, a plurality of second gate structures on the second region of the substrate, and a first stress layer in the substrate on both sides of each first gate structure;
   forming a first-region mask layer on the first stress layer and on the first stress layer;
   forming a second stress layer in the substrate on both sides of each second gate structure using the first-region mask layer as a mask;
   forming a contact-hole etch stop layer on the first stress layer and on the second stress layer;

forming a plurality of first contact holes on the first stress layer and a plurality of second contact holes on the second stress layer, wherein the contact-hole etch stop layer formed on the first stress layer is exposed at a bottom of each first contact hole, and the contact-hole etch stop layer formed on the second stress layer is exposed at a bottom of each second contact hole;

removing at least a portion of the contact-hole etch stop layer exposed at the bottom of each first contact hole; and removing the first-region mask layer at the bottom of each first contact hole and the contact-hole etch stop layer at the bottom of each second contact hole to expose the first stress layer and the second stress layer, respectively wherein removing the at least a portion of the contact-hole etch stop layer exposed at the bottom of each first contact hole includes:

forming a protection layer on the second region of the substrate;

performing a thinning down process along a depth direction of each first contact hole to remove the at least a portion of the contact-hole etch stop layer exposed at the bottom of each first contact hole; and removing the protection layer to expose the contact-hole etch stop layer at the bottom of each second contact hole.

8. The method according to claim 7, wherein:
the protection layer fills up each second contact hole.

9. The method according to claim 7, wherein:
the protection layer has a structure including one or more of a photoresist layer, an organic dielectric layer, and a bottom anti-reflection layer.

10. The method according to claim 7, wherein:
at least one of the first-region mask layer and the contact-hole etch stop layer is made of $SiN_x$.

11. The method according to claim 10, wherein parameters of the thinning down process include:
an etch gas including $CH_2F_2$, $O_2$, and $CF_4$;
a flow rate of $CH_2F_2$ in a range of approximately 8 sccm to 50 sccm;
a flow rate of $O_2$ in a range of approximately 2 sccm to 30 sccm;
a flow rate of CF4 in a range of approximately 30 sccm to 200 sccm;
a radio frequency (RF) power in a range of approximately 100 W to 1000 W;
a voltage in a range of approximately 30 V to 500 V;
an etch time in a range of approximately 4 s to 500 s; and
a pressure in a range of approximately 10 mTorr to 2000 mTorr.

12. The method according to claim 7, wherein:
the protection layer is removed through dry etching.

13. The method according to claim 7, after performing the thinning down process and prior to removing the protection layer, further including:
performing a contact implantation process on the first stress layer along the depth direction of each first contact hole using the protection layer as a mask.

14. The method according to claim 13, wherein:
a plurality of transistors formed on the first region of the substrate are P-type metal-oxide-semiconductor (PMOS) transistors;
a plurality of transistors formed on the second region of the substrate are N-type metal-oxide-semiconductor (NMOS) transistors; and
process parameters of the contact implantation process include:
an implantation energy in a range of approximately 1 keV to 50 keV; and
an implantation dose in a range of approximately $1.0E14$ atom/cm$^2$ to $1.0E16$ atom/cm$^2$.

15. The method according to claim 7, further including:
forming a first plug in each first contact hole and a second plug in each second contact hole.

16. The method according to claim 7, wherein:
the thinning down process includes dry etching.

17. The method according to claim 7, wherein:
a thickness of the at least a portion of the contact-hole etch stop layer removed is in a range of approximately 30 Å to 200 Å.

18. The method according to claim 7, wherein:
the contact-hole etch stop layer exposed at the bottom of each first contact hole is fully removed.

19. The method according to claim 18, wherein:
the contact-hole etch stop layer exposed at the bottom of each first contact hole and a top portion of the first-region mask layer formed at the bottom of each first contact hole are removed.

* * * * *